US009941277B2

(12) United States Patent
Yoon et al.

(10) Patent No.: US 9,941,277 B2
(45) Date of Patent: Apr. 10, 2018

(54) SEMICONDUCTOR DEVICES INCLUDING INCREASED AREA CONTACTS

(71) Applicants: Changseop Yoon, Yangsan-si (KR); Soon Cho, Hwaseong-si (KR)

(72) Inventors: Changseop Yoon, Yangsan-si (KR); Soon Cho, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 104 days.

(21) Appl. No.: 15/054,852

(22) Filed: Feb. 26, 2016

(65) Prior Publication Data

US 2016/0284700 A1 Sep. 29, 2016

(30) Foreign Application Priority Data

Mar. 25, 2015 (KR) ........................ 10-2015-0041637

(51) Int. Cl.
| H01L 29/76 | (2006.01) |
| H01L 29/94 | (2006.01) |
| H01L 27/088 | (2006.01) |
| H01L 29/417 | (2006.01) |
| H01L 27/12 | (2006.01) |
| H01L 29/78 | (2006.01) |
| H01L 29/66 | (2006.01) |
| H01L 27/092 | (2006.01) |

(Continued)

(52) U.S. Cl.
CPC ...... *H01L 27/0886* (2013.01); *H01L 27/0924* (2013.01); *H01L 27/1211* (2013.01); *H01L 29/41791* (2013.01); *H01L 29/66795* (2013.01); *H01L 29/785* (2013.01); *H01L 29/7848* (2013.01); *H01L 21/823418* (2013.01); *H01L 21/823431* (2013.01); *H01L 21/823475* (2013.01); *H01L 21/823814* (2013.01); *H01L 21/823821* (2013.01); *H01L 21/823871* (2013.01)

(58) Field of Classification Search
CPC ............. H01L 27/0886; H01L 27/0924; H01L 21/823871; H01L 21/823821; H01L 21/823431; H01L 21/823475; H01L 29/41791; H01L 21/823814; H01L 21/823418; H01L 29/785; H01L 29/7848; H01L 29/66795; H01L 27/1211
USPC ......................................... 257/401, 369, 368
See application file for complete search history.

(56) References Cited

U.S. PATENT DOCUMENTS

| 8,679,925 B2 | 3/2014 | Wang |
| 8,921,191 B2 | 12/2014 | Cai et al. |
| 9,012,287 B2 | 4/2015 | Liaw |

(Continued)

*Primary Examiner* — Shouxiang Hu
(74) *Attorney, Agent, or Firm* — Ward and Smith, P.A.

(57) ABSTRACT

A semiconductor device can include a plurality of active patterns protruding from a substrate and spaced apart on the substrate by first and second distances. A plurality of selective epitaxial growth portions can be each grown on an upper surface of a respective one of the plurality of active patterns. A source/drain contact can be extending across the plurality of selective epitaxial growth portions to remain above top surfaces of first ones of plurality of active patterns that are spaced apart by the first distance between the first ones of plurality of active patterns and can include an extension that extends toward the substrate to below top surfaces of two of the plurality of active patterns that are spaced apart by the second distance between the two of the plurality of active patterns.

20 Claims, 31 Drawing Sheets

(51) Int. Cl.
    *H01L 21/8234*     (2006.01)
    *H01L 21/8238*     (2006.01)

(56)     References Cited

U.S. PATENT DOCUMENTS

| | | |
|---|---|---|
| 9,105,691 B2 | 8/2015 | Cheng et al. |
| 9,166,010 B2 * | 10/2015 | Kelly ................ H01L 29/0653 |
| 9,443,769 B2 * | 9/2016 | Wang .............. H01L 21/823481 |
| 2011/0227162 A1 | 9/2011 | Lin et al. |
| 2013/0187228 A1 | 7/2013 | Xie et al. |
| 2014/0159159 A1 | 6/2014 | Steigerwald et al. |
| 2014/0203370 A1 | 7/2014 | Maeda et al. |
| 2014/0273369 A1 | 9/2014 | Wei et al. |
| 2015/0340468 A1 * | 11/2015 | Lim ................. H01L 29/66795 |
| | | 438/283 |
| 2016/0035788 A1 * | 2/2016 | Kim ..................... H01L 29/456 |
| | | 438/3 |
| 2016/0111537 A1 * | 4/2016 | Tsai ................... H01L 29/7848 |
| | | 257/192 |

* cited by examiner

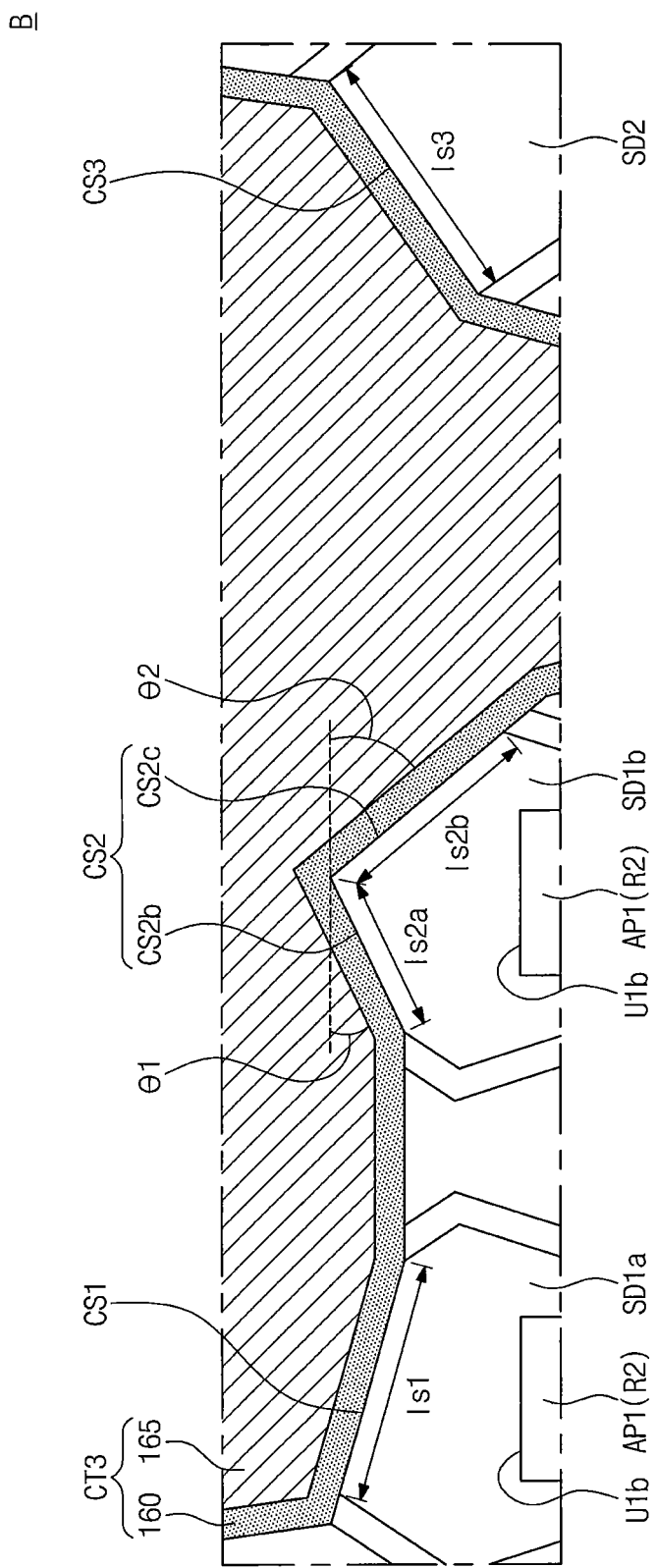

SEMICONDUCTOR DEVICES INCLUDING INCREASED AREA CONTACTS

CROSS-REFERENCE TO RELATED APPLICATION

This U.S. non-provisional patent application claims priority under 35 U.S.C. § 119 to Korean Patent Application No. 10-2015-0041637, filed on Mar. 25, 2015, in the Korean Intellectual Property Office, the disclosure of which is hereby incorporated by reference in its entirety.

FIELD

The inventive concepts relate to a semiconductor device and, more particularly, to a semiconductor device including a fin field effect transistor.

BACKGROUND

A semiconductor device may include an integrated circuit including metal-oxide-semiconductor field effect transistors (MOSFETs). The operating characteristics of such semiconductor devices may deteriorate as the MOSFETs are scaled down.

SUMMARY

Embodiments according to the inventive concept can provide semiconductor devices including increased area contacts. Pursuant to these embodiments, a semiconductor device that includes a plurality of active patterns protruding from a substrate and spaced apart on the substrate by first and second distances. A plurality of selective epitaxial growth portions can be each grown on an upper surface of a respective one of the plurality of active patterns. A source/drain contact can be extending across the plurality of selective epitaxial growth portions to remain above top surfaces of first ones of plurality of active patterns that are spaced apart by the first distance between the first ones of plurality of active patterns and can include an extension that extends toward the substrate to below top surfaces of two of the plurality of active patterns that are spaced apart by the second distance between the two of the plurality of active patterns.

In some embodiments according to the inventive concept, the first distance is less than the second distance. In some embodiments according to the inventive concept, the second distance is predetermined so that the extension extends below the top surfaces of the two of the plurality of active patterns that are spaced apart by the second distance.

In some embodiments according to the inventive concept, the extension contacts an insulating layer at a bottom of a recess between the two of the plurality of active patterns that are spaced apart by the second distance. In some embodiments according to the inventive concept, two of the plurality of active patterns that are spaced apart by the second distance have different heights relative to the substrate.

In some embodiments according to the inventive concept, two of the plurality of active patterns that are spaced apart by the second distance include a first active pattern having a first height and a second active pattern having a second height that is less than the first height. In some embodiments according to the inventive concept, the first active pattern includes a first one of the selective growth patterns grown on sidewalls of the first active pattern and the second active pattern includes a second one of the selective growth patterns that is absent from sidewalls of the second active pattern.

In some embodiments according to the inventive concept, the source/drain contact includes a respective flat central surface on each of the selective epitaxial growth portions. In some embodiments according to the inventive concept, the source/drain contact further includes at least one respective inclined edge surface on the each of the selective epitaxial growth portions.

In some embodiments according to the inventive concept, the at least one respective inclined edge surface includes a first respective inclined edge surface and the source/drain contact further includes a second respective inclined edge surface on the each of the selective epitaxial growth portions opposite the first respective inclined edge surface. In some embodiments according to the inventive concept, the first and second respective inclined edge surfaces are inclined at different angles relative to the substrate.

In some embodiments according to the inventive concept, a semiconductor device includes first, second, and third active patterns protruding from a substrate, the first and second active patterns spaced apart from each other by a first distance, and the third active pattern spaced apart from the second active pattern by a second distance greater than the first distance. A gate structure can intersect the first to third active patterns and first, second, and third source/drain regions are respectively disposed on the first, second, and third active patterns at a first side of the gate structure. A source/drain contact can intersect the first, second, and third active patterns, the source/drain contact connected in common to the first, second, and third source/drain regions, wherein the source/drain contact includes first, second, and third contact surfaces in contact with the first, second, and third source/drain regions, respectively and an extension extending to a lower level of the device than the first to third contact surfaces and disposed between the second and third active patterns, wherein sidewalls of the extension are spaced apart from corresponding sidewalls of the second and third active patterns.

In some embodiments according to the inventive concept, a semiconductor device includes a substrate including a first region and a second region. A plurality of first active fin patterns can protrude from the substrate of the first region and a second active fin pattern can protrude from the substrate of the second region. A gate structure can intersect the plurality of first active fin patterns and the second active fin pattern. A plurality of source/drain regions can be respectively disposed on the plurality of the first active fin patterns and the second active fin pattern at a first side of the gate structure and a source/drain contact can intersect the plurality of first active fin patterns and the second active fin pattern, the source/drain contact connected in common to the plurality of source/drain regions, wherein the source/drain contact include a plurality of contact surfaces in contact with the plurality of source/drain regions, respectively, and an extension extending to a lower level in the device than the plurality of contact surfaces wherein the extension is between the second active fin pattern and one of the first active fin patterns that is adjacent to the second region, and wherein sidewalls of the extension are spaced apart from corresponding sidewalls of the second active fin pattern and the first active fin pattern adjacent to the second region.

In some embodiments according to the inventive concept, a semiconductor device includes a substrate including a first region and a second region and a first transistor provided on the first region, wherein the first transistor includes a first gate electrode and a first source/drain region disposed at one side of the first gate electrode, and wherein the first source/drain region comprises: a plurality of first epitaxial patterns respectively disposed on a plurality of first active patterns protruding from the substrate of the first region. A second transistor can be provided on the second region, wherein the second transistor includes a second gate electrode and a second source/drain region can be disposed at one side of the second gate electrode, and wherein the second source/drain regions includes a second epitaxial pattern disposed on a second active pattern protruding from the substrate of the second region and a source/drain contact can intersect the plurality of first active patterns and the second active pattern, the source/drain contact can be connected in common to the first and second source/drain regions, wherein the source/drain contact includes contact surfaces being in contact with the plurality of first epitaxial patterns and the second epitaxial pattern, respectively and an extension disposed at a lower level than the contact surfaces, and wherein the extension is disposed between the second active pattern and one, adjacent to the second region, of the first active patterns.

BRIEF DESCRIPTION OF THE DRAWINGS

FIGS. 4A to 4C are enlarged views corresponding to a portion 'B' of FIG. 3A.

FIGS. 5A to 13A are cross-sectional views corresponding to the lines I-I' and II-II' of FIG. 1 to illustrate a method of manufacturing a semiconductor device according to example embodiments of the inventive concepts.

FIGS. 5B to 13B are cross-sectional views corresponding to the lines and IV-IV' of FIG. 1 to illustrate a method of manufacturing a semiconductor device according to example embodiments of the inventive concepts.

DETAILED DESCRIPTION OF THE EMBODIMENTS

Figure 1:
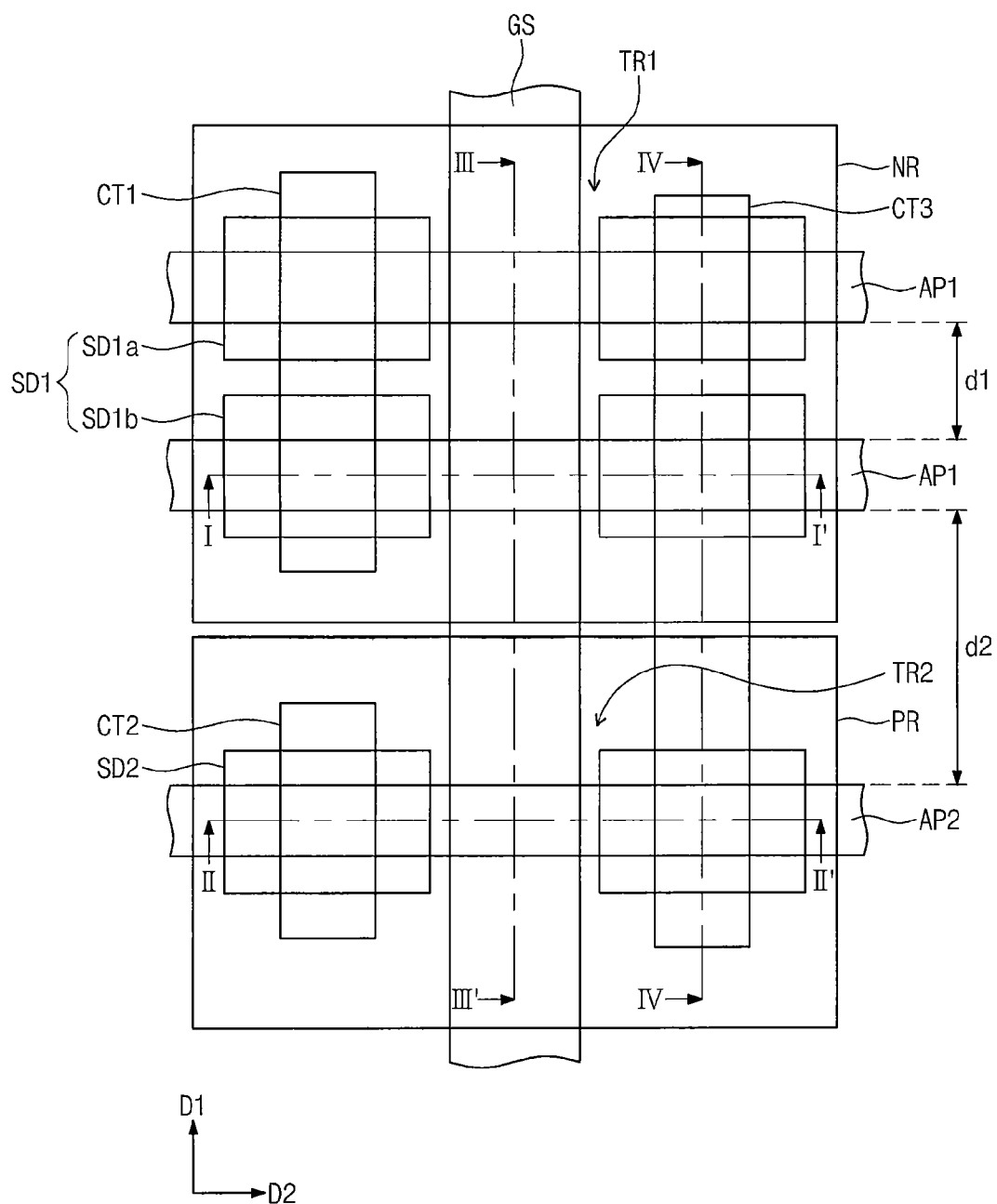
FIG. 1 is a plan view illustrating a semiconductor device according to example embodiments of the inventive concepts.

The inventive concepts are described hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
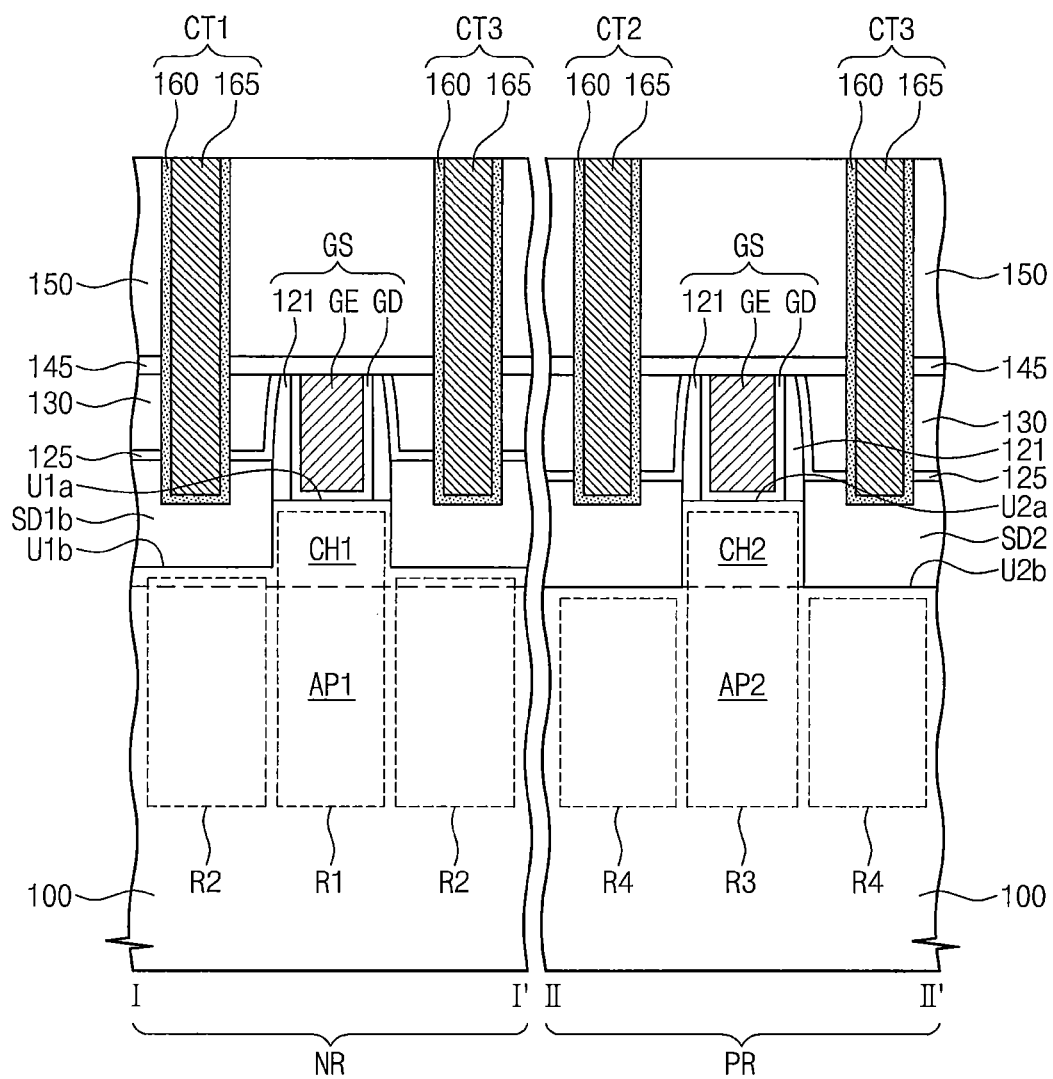
FIG. 2A is a cross-sectional view taken along lines I-I' and II-II' of FIG. 1.
Figure 2B:
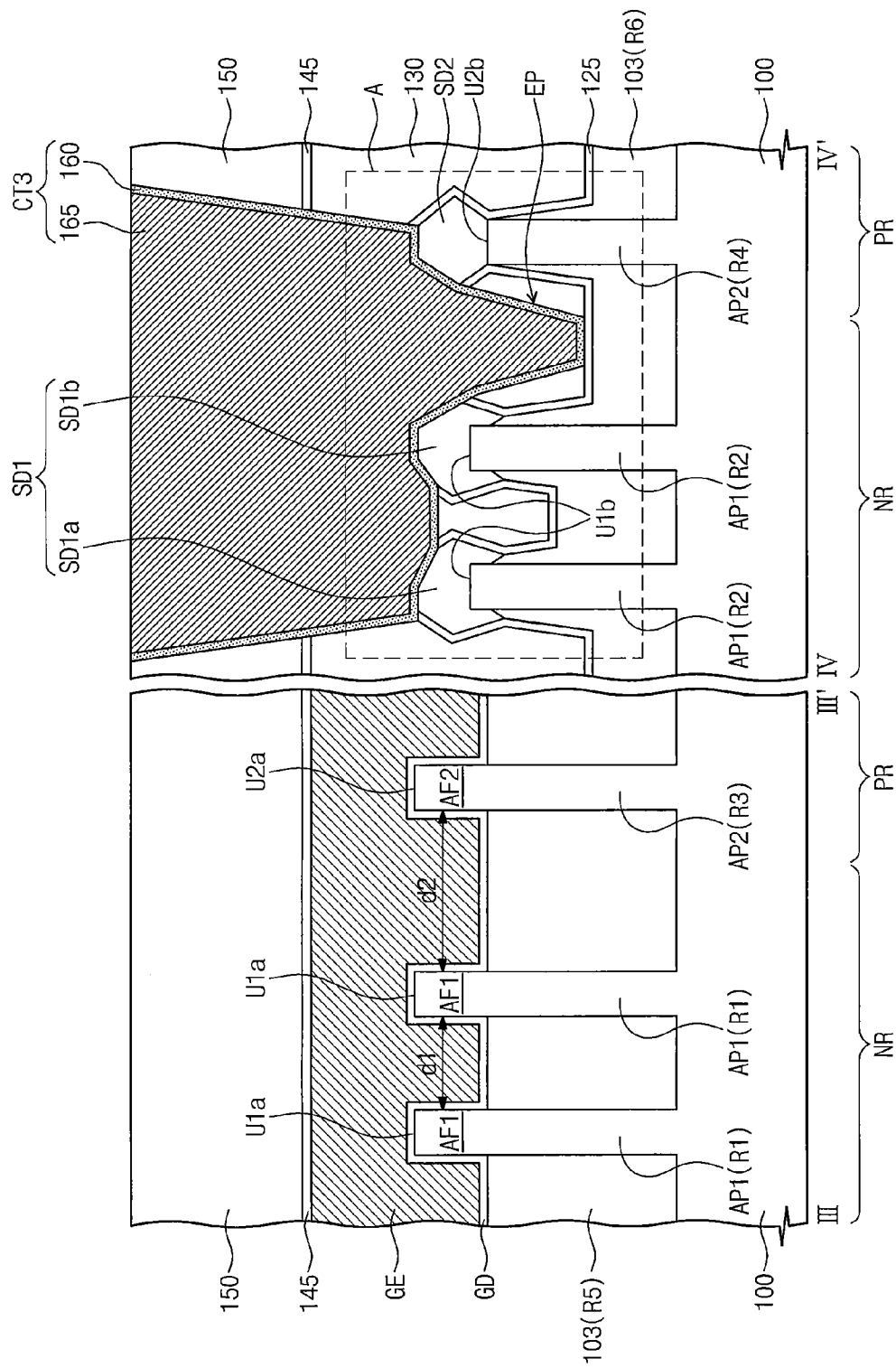
FIG. 2B is a cross-sectional view taken along lines and IV-IV' of FIG. 1.
Figure 3A:
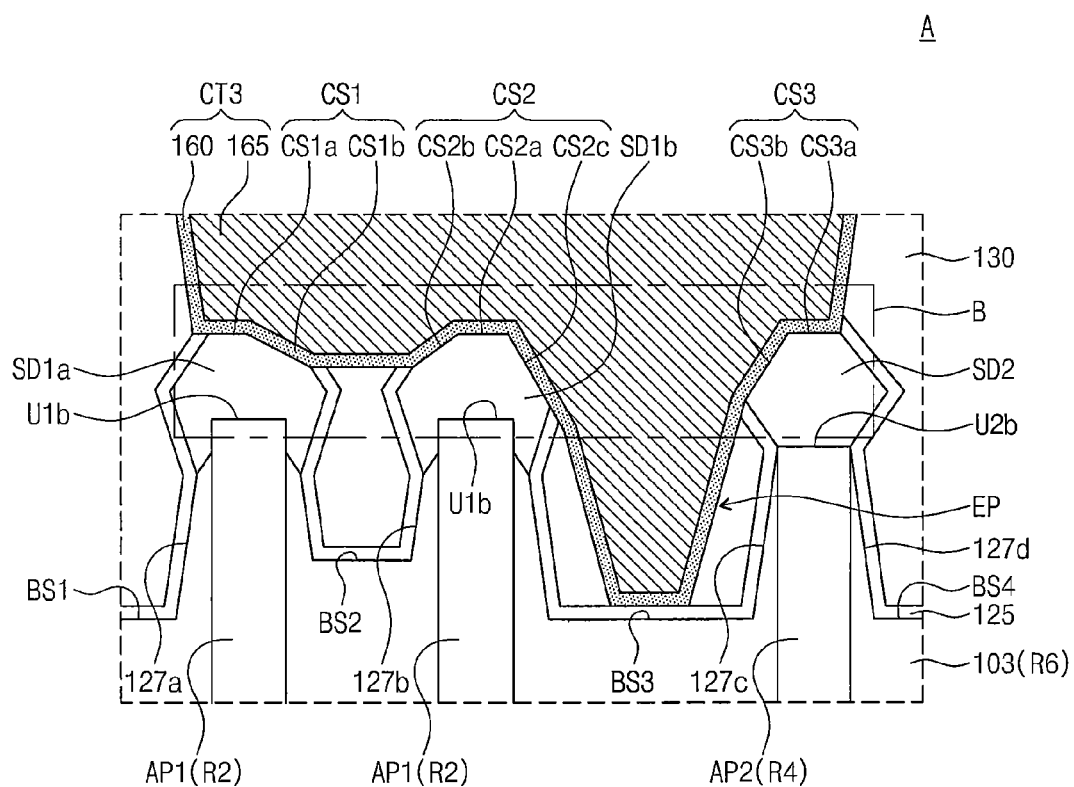
FIGS. 3A to 3C are enlarged views corresponding to a portion 'A' of FIG. 2B.
Figure 3B:
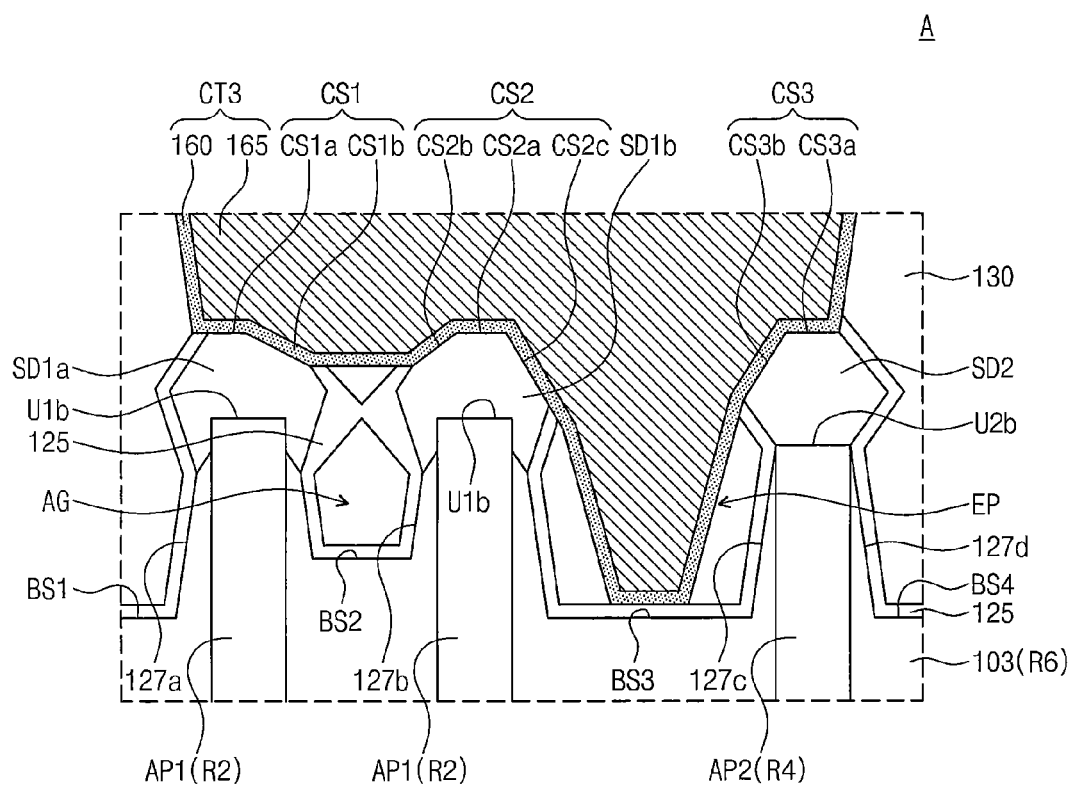
Figure 3C:
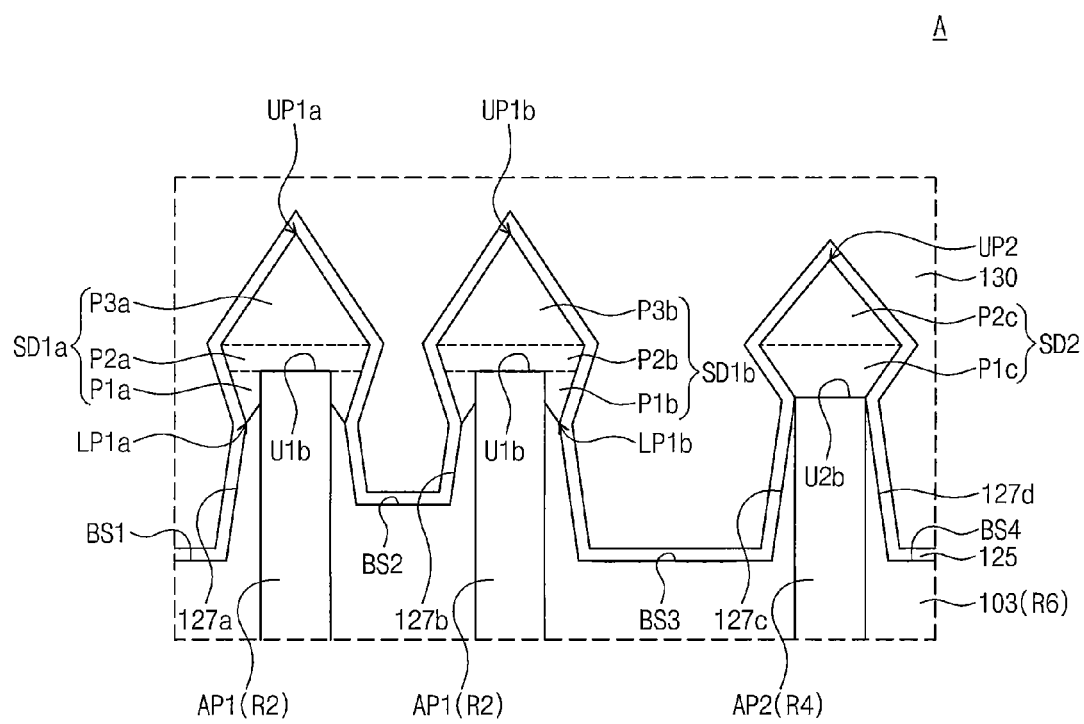
Figure 4A:
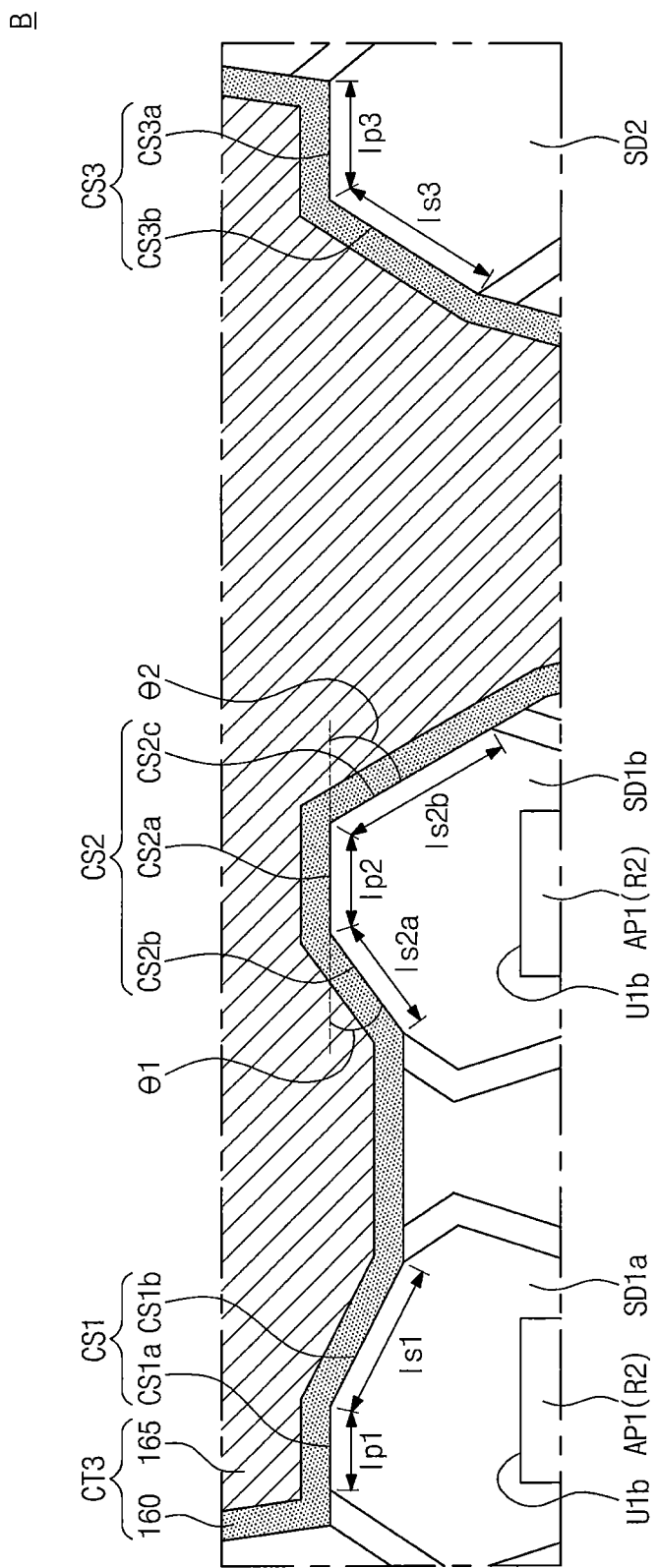
Figure 4C:
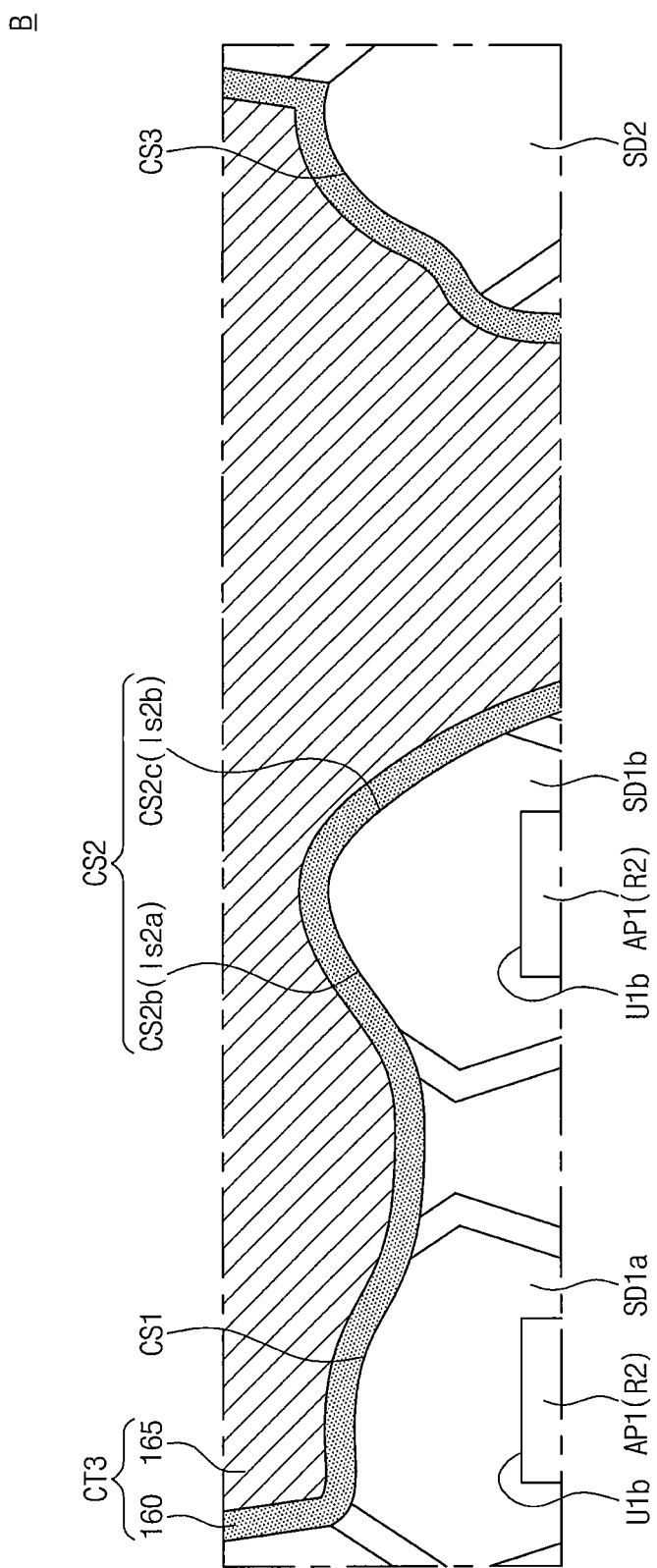

FIG. 1 is a plan view illustrating a semiconductor device according to example embodiments of the inventive concepts. FIG. 2A is a cross-sectional view taken along lines I-I' and II-II' of FIG. 1, and FIG. 2B is a cross-sectional view taken along lines III-III' and IV-IV' of FIG. 1. FIGS. 3A to 3C are enlarged views corresponding to a portion 'A' of FIG. 2B. FIGS. 4A to 4C are enlarged views corresponding to a portion 'B' of FIG. 3A.

Referring to FIGS. 1, 2A, 2B, and 3A, a substrate 100 including an NMOSFET region NR and a PMOSFET region PR may be provided. The substrate 100 may be a semiconductor substrate. For example, the substrate 100 may be a silicon substrate, a germanium substrate, or a silicon-on-insulator (SOI) substrate. In the present embodiment, the NMOSFET region NR may be defined as an active region on which one N-type transistor is disposed, and the PMOSFET region PR may be defined as an active region on which one P-type transistor is disposed. The NMOSFET region NR and the PMOSFET region PR may be arranged along, for example, a first direction D1.

Active patterns may be provided on the active regions NR and PR. The active patterns may include a first active pattern AP1 disposed on the NMOSFET region NR, and a second active pattern AP2 disposed on the PMOSFET region PR. The first active pattern AP1 may have a P-type conductivity, and the second active pattern AP2 may have an N-type conductivity. The first and second active patterns AP1 and AP2 may be arranged along the first direction D1 and may extend in a second direction D2 intersecting the first direction D1. The first and second active patterns AP1 and AP2 may protrude from the substrate 100 in a direction perpendicular to a top surface of the substrate 100. The first and second active patterns AP1 and AP2 may be portions of the substrate 100 or may be epitaxial patterns formed on the substrate 100. According to some inventive concepts, the first active pattern AP1 may be provided in plurality. In some embodiments, the number of the first active patterns AP1 disposed on the NMOSFET region NR may be two. However, the inventive concepts are not limited thereto. Unlike FIG. 1, the number of the first active patterns AP1 on the NMOSFET region NR may be three or more. One second active pattern AP2 is disposed on the PMOSFET region PR in FIG. 1. However, the inventive concepts are not limited thereto. In other embodiments, a plurality of second active patterns AP2 may be provided in the PMOSFET region PR. Hereinafter, a pair of the first active patterns AP1 on the NMOSFET region NR and the one second active pattern AP2 on the PMOSFET region PR will be described as an example for the purpose of ease and convenience in explanation.

According to some embodiments, the first active patterns AP1 may be spaced apart from each other by a first distance d1, and the second active pattern AP2 may be spaced apart from the first active pattern AP1 adjacent thereto by a second distance d2. The second distance d2 may be greater than the first distance d1. The NMOSFET region and the PMOSFET region have different conductivity types, and the second distance d2 may be the minimum distance sufficient to isolate the NMOSFET region NR from the PMOSFET region PR.

A gate structure GS may be disposed on the substrate 100. The gate structure GS may extend in the first direction D1 to intersect the first active patterns AP1 and the second active pattern AP2. The gate structure GS may cover portions of sidewalls of the first active patterns AP1 and portions of sidewalls of the second active pattern AP2. In the present embodiment, the gate structure GS intersects the first active patterns AP1 and the second active pattern AP2. However, the inventive concepts are not limited thereto. In other embodiments, the gate structure GS may intersect the first active patterns AP1 but may not be disposed on the second active pattern AP2, unlike FIG. 1.

Each of the first active patterns AP1 may include a first region R1 disposed under the gate structure GS and second regions R2 disposed at both sides of the gate structure GS. The second active pattern AP2 may include a third region R3 disposed under the gate structure GS and fourth regions R4 disposed at both sides of the gate structure GS. A height of top surfaces U1b of the second regions R2 may be lower than that of a top surface U1a of the first region R1, and a height of top surfaces U2b of the fourth regions R4 may be lower than that of a top surface U2a of the third region R3. In addition, the height of the top surfaces U2b of the fourth regions R4 may be lower than the height of the top surfaces U1b of the second regions R2.

A device isolation pattern 103 may be disposed on the substrate 100 to cover portions of the sidewalls of the first and second active patterns AP1 and AP2. In other words, upper portions of the first and second active patterns AP1 and AP2 may be exposed by the device isolation pattern 103. In detail, the device isolation pattern 103 may include a fifth region R5 disposed under the gate structure GS and sixth regions R6 disposed at both sides of the gate structure GS. The fifth region R5 of the device isolation pattern 103 may expose the upper portions of the first regions R1 of the first active patterns AP1 and the upper portion of the third region R3 of the second active pattern AP2. The exposed upper portion of the first region R1 may be defined as a first active fin AF1, and the exposed upper portion of the third region R3 may be defined as a second active fin AF2. The first and second active fins AF1 and AF2 may include first and second channel regions CH1 and CH2, respectively. Meanwhile, portions of upper portions of the sixth regions R6 of the device isolation pattern 103 may be recessed relative to the upper portion of the fifth region R5. In other words, the sixth regions R6 of the device isolation pattern 103 may include a plurality of recess regions. In some embodiments, the plurality of recess regions may include a first recess region 127a disposed at a side of the first active patterns AP1, a second recess region 127b disposed between the first active patterns AP1, a third recess region 127c disposed between the second active pattern AP2 and the first active pattern AP1 adjacent to the second active pattern AP2, and a fourth recess region 127d disposed at a side of the second active pattern AP2. The first active patterns AP1, the second active pattern AP2, and the second and third recess regions 127b and 127c may be disposed between the first recess region 127a and the fourth recess region 127d. A recessed depth of a recess region may be varied depending on a density of patterns (or spacing between adjacent patterns). In other words, a recess region between active patterns arranged at a relatively narrow spacing may be shallower than a recess region between active patterns arranged at a relatively wide spacing. For example, a bottom surface BS2 of the second recess region 127b may be higher than bottom surfaces BS1, BS3, and BS4 of the first, third, and fourth recess regions 127a, 127c, and 127d. In some embodiments, portions of the sidewalls of the second regions R2 of the first active patterns AP1 may be exposed by the sixth regions R6 of the device isolation pattern 103. On the contrary, sidewalls of the fourth regions R4 of the second active pattern AP2 may not be exposed by the sixth regions R6. In some embodiments, portions of the sidewalls of the fourth regions R4 of the second active pattern AP2 may be exposed by the sixth regions R6, unlike FIGS. 2B and 3A. The device isolation pattern 103 may include silicon oxide.

Source/drain regions may be disposed at both sides of the gate structure GS. The source/drain regions may include first source/drain regions SD1 disposed on the first active patterns AP1, and second source/drain regions SD2 disposed on the second active pattern AP2. In more detail, the first source/drain region SD1 disposed at each side of the gate structure GS may include a first sub-source/drain region SD1a and a second sub-source/drain region SD1b which are respectively disposed at the second regions R2 of the first active patterns AP1 disposed at each side of the gate structure GS. The second source/drain regions SD2 may be disposed on the fourth regions R4 of the second active pattern AP2, respectively. In the present embodiment, the first and second sub-source/drain regions SD1a and SD1b may have an N-type conductivity, and the second source/drain regions SD2 may have a P-type conductivity. In some embodiments, the first and second sub-source/drain regions SD1a and SD1b and the second source/drain regions SD2 may be epitaxial patterns formed using the active patterns AP1 and AP2 thereunder as seed layers, respectively. In this case, the first and second sub-source/drain regions SD1a and SD1b may include a material capable of providing a tensile strain to the first channel regions CH1, and the second source/drain regions SD2 may include a material capable of providing a compressive stain to the second channel region CH2. For example, if the substrate 100 is a silicon substrate, the first and second sub-source/drain regions SD1a and SD1b may include a silicon carbide (SiC) layer having a lattice constant smaller than that of silicon, or a silicon (Si) layer having a lattice constant substantially equal to that of the substrate 100. In addition, the second source/drain region SD2 may include a silicon-germanium (SiGe) layer having a lattice constant greater than that of silicon. Each of the first channel regions CH1 may be disposed between the first source/drain regions SD1 adjacent to each other in a horizontal direction, and the second channel regions CH2 may be disposed between the second source/drain regions SD2 adjacent to each other in the horizontal direction.

Referring to FIG. 3C, in one cross-sectional view, the first and second sub-source/drain regions SD1a and SD1b may have different shapes compared to the second source/drain regions SD2. FIG. 3C is one cross-sectional view illustrating source/drain regions which are not in contact with a source/drain contact. In more detail, the first sub-source/drain region SD1a may include first portions P1 disposed on opposite sidewalls of the second region R2 thereunder, a second portion P2a having a width substantially increasing as a distance from the substrate 100 increases, and a third portion P3a having a width substantially decreasing as a distance from the substrate 100 increases. At this time, the first portion P1a may be disposed at a lower level than the top surface U1b of the second region R2, and the second and third portions P2a and P3a may be disposed at higher levels than the top surface U1b of the second region R2. In addition, the lowermost end LP1a of the first portion P1a may be spaced apart from the sidewalls of the second region R2. The second sub-source/drain region SD1b may have the substantially same shape as the first sub-source/drain region SD1a. In other words, first, second, and third portions P1b, P2b, and P3b of the second sub-source/drain region SD1b may have shapes that correspond to the first, second, and third portions P1a, P2a, and P3a of the first sub-source/drain region SD1a, respectively, when viewed from one cross-sectional view. In addition, the lowermost end LP1b of the first portion P1b of the second sub-source/drain region SD1b may be spaced apart from the sidewalls of the second region R2 disposed under the second sub-source/drain region SD1b. On the contrary, the second source/drain region SD2 may include a first portion P1c and a second portion P2c. The first portion P1c of the second source/drain region SD2 may be in contact with the top surface U2b of the fourth region R4 of the second active pattern AP2 and may have a width substantially increasing as a distance from the substrate 100 increases. The second portion P2c of the second source/drain region SD2 may extend from the first portion P1c and may have a width substantially decreasing as a distance from the substrate 100 increases. The uppermost ends UP1a and UP1b of the first and second sub-source/drain regions SD1a and SD1b may be higher than the uppermost ends UP2 of the second source/drain regions SD2.

Referring again to FIGS. 1, 2A, 2B, and 3A, a contact etch stop layer 125 may be disposed on the substrate 100. The contact etch stop layer 125 may cover inner surfaces of the recess regions (e.g., the first to fourth recess regions 127a to 127d) of the device isolation pattern 103 and may extend onto surfaces of the first and second source/drain regions SD1 and SD2 and both sidewalls of the gate structure GS. The contact etch stop layer 125 may include a material having an etch selectivity with respect to a first interlayer insulating layer 130. For example, the contact etch stop layer 125 may include a silicon nitride layer and/or a silicon oxynitride layer.

A first interlayer insulating layer 130 may be disposed on the substrate 100 to cover the first and second source/drain regions SD1 and SD2 and the both sidewalls of the gate structure GS. A top surface of the first interlayer insulating layer 130 may be coplanar with a top surface of the gate structure GS. According to some embodiments, the first interlayer insulating layer 130 may fully fill the recess regions (e.g., the first to fourth recess regions 127a to 127d) of the device isolation pattern 103 on which the contact etch stop layer 125 is formed. According to some embodiments, a portion of the recess regions may not be filled with the first interlayer insulating layer 130. As illustrated in FIG. 3B, the second recess region 127b may not be filled with the first interlayer insulating layer 130. In other words, a gap AG may be formed in the second recess region 127b. The gap AG may be a region in which a solid material is not provided, so the gap AG may correspond to a substantially empty space. Since a space between the first active patterns AP1 is narrow, portions of the contact etch stop layer 125 formed on the sidewalls of the first and second sub-source/drain regions SD1a and SD1b may be connected to each other to form the gap AG in the second recess region 127b. In other words, the gap AG may be defined by the contact etch stop layer 125 covering the inner surface of the second recess region 127b. Since the gap AG is formed in the second recess region 127b, a parasitic capacitance between the first active patterns AP1 may be reduced or minimized. The first interlayer insulating layer 130 may include at least one of a silicon oxide layer or low-k dielectric layers.

The gate structure GS may include a gate electrode GE, a gate spacer 121 disposed between the gate electrode GE and the first interlayer insulating layer 130, and a gate dielectric pattern GD disposed between the gate electrode GE and the gate spacer 121. The gate dielectric pattern GD may also be disposed between the gate electrode GE and the active fins AF1 and AF2 and may horizontally extend from the active fins AF1 and AF2 to cover a top surface of the fifth region R5 of the device isolation pattern 103. The gate dielectric pattern GD may extend along a bottom surface of the gate electrode GE.

The gate electrode GE may include at least one of a conductive metal nitride (e.g., titanium nitride or tantalum nitride) or a metal (e.g., aluminum or tungsten). The gate spacer 121 may include a nitride (e.g., silicon nitride). The gate dielectric pattern GD may include at least one of high-k dielectric layers. For example, the gate dielectric pattern GD may include at least one of, but not limited to, hafnium oxide, hafnium silicate, zirconium oxide, or zirconium silicate.

The gate electrode GE, the gate dielectric pattern GD, and the first source/drain regions SD1, which are disposed on the NMOSFET region NR, may constitute a first transistor TR1 of an N-type. In other words, the first transistor TR1 may be realized as an N-type multi-fin field effect transistor. Thus, an on-current characteristic of the first transistor TR1 may be improved. The gate electrode GE, the gate dielectric pattern GD, and the second source/drain regions SD2, which are disposed on the PMOSFET region PR, may constitute a second transistor TR2 of a P-type. In other words, the second transistor TR2 may be realized as a P-type single-fin field effect transistor.

A second interlayer insulating layer 150 may be disposed on the substrate 100. The second interlayer insulating layer 150 may cover the first interlayer insulating layer 130 and the gate structure GS. The second interlayer insulating layer 150 may include at least one of a silicon oxide layer, a silicon nitride layer, a silicon oxynitride layer, or low-k dielectric layers. In some embodiments, a gate capping layer 145 may be disposed between the second interlayer insulating layer 150 and the gate structure GS and between the second interlayer insulating layer 150 and the first interlayer insulating layer 130. In other words, the gate capping layer 145 may cover the top surface of the gate structure GS and may extend onto the top surface of the first interlayer insulating layer 130. In some embodiments, unlike FIGS. 2A and 2B, the gate capping layer 145 may be locally disposed on the top surface of the gate electrode GE and may not cover the top surface of the first interlayer insulating layer 130. In some embodiments, the gate capping layer 145 may be omitted. The gate capping layer 145 may include, for example, a silicon nitride layer.

Source/drain contacts may be disposed at both sides of the gate structure GS. The source/drain contacts may penetrate the second interlayer insulating layer 150, the gate capping layer 145, the first interlayer insulating layer 130, and the contact etch stop layer 125 to connect to the source/drain regions. In more detail, the source/drain contacts may include first and second source/drain contacts CT1 and CT2 disposed at one side of the gate structure GS, and a third contact CT3 disposed at another side of the gate structure GS. The first source/drain contact CT1 may be connected in common to the first and second sub-source/drain regions SD1a and SD1b disposed at the one side of the gate structure GS, and the second source/drain contact CT2 may be connected to the second source/drain region SD2 disposed at the one side of the gate structure GS. The third source/drain contact CT3 may be connected in common to the first and second sub-source/drain regions SD1a and SD1b and the second source/drain region SD2 which are disposed at the opposite side of the gate structure GS. In a plan view, the first source/drain contact CT1 may intersect the first active patterns AP1, and the second source/drain contact CT2 may intersect the second active pattern AP2. The third source/drain contact CT3 may intersect the first active patterns AP1 and the second active pattern AP2 in a plan view. Each of the first to third source/drain contacts CT1 to CT3 may include a first conductive layer 160 and a second conductive layer 165 on the first conductive layer 160. The first conductive layer 160 may include a barrier conductive layer. For example, the first conductive layer 160 may include at least one of a titanium nitride layer, a tungsten nitride layer, or a tantalum nitride layer. The second conductive layer 165 may include a metal layer. For example, the second conductive layer 165 may include at least one of tungsten, titanium, or tantalum. In some embodiments, the first to third source/drain contacts CT1 to CT3 may include a doped semiconductor material. Each of the first to third source/drain contacts CT1 to CT3 may further include a metal silicide layer disposed between the first conductive layer 160 and the source/drain region connected to each of the first to third source/drain contacts CT1 to CT3. For example, the metal silicide layer may include at least one of titanium silicide, tantalum silicide, or tungsten silicide. The first to third source/drain contacts CT1 to CT3 may be formed in the same step, so top surfaces of the first to third source/drain contacts CT1 to CT3 may be substantially coplanar with each other. However, profiles of bottom surfaces of the first to third source/drain contacts CT1 to CT3 may be different from each other.

Referring to FIG. 4A, the third source/drain contact CT3 may have contact surfaces that are in contact with the first and second sub-source/drain regions SD1a and SD1b and the second source/drain region SD2 which are disposed at the opposite side of the gate structure GS. The contact surfaces of the third source/drain contact CT3 may include a first contact surface CS1 in contact with the first sub-source/drain region SD1a, a second contact surface CS2 in contact with the second sub-source/drain region SD1b, and a third contact surface CS3 in contact with the second source/drain region SD2. In other words, the first and second sub-source/drain regions SD1a and SD1b and the second source/drain region SD2 which are in contact with the third source/drain contact CT3 may have the first contact surface CS1, the second contact surface CS2, and the third contact surface CS3, respectively.

According to some embodiments, each of the first to third contact surfaces CS1 to CS3 may include a flat surface parallel to a top surface of the substrate 100, and an inclined surface extending from an end of the flat surface so as to be inclined downward toward the substrate 100. In more detail, the first contact surface CS1 may include a first flat surface CS1a, and a first inclined surface CS1b extending from an end of the first flat surface CS1a so as to be inclined downward. The second contact surface CS2 may include a second flat surface CS2a and a second inclined surface. The second inclined surface of the second contact surface CS2 may include two inclined surfaces extending from both ends of the second flat surface CS2a so as to be inclined downward toward the substrate 100. In other words, the second inclined surface may include (respectively) a first sub-inclined surface CS2b facing the first sub-source/drain region SD1a, and a second sub-inclined surface CS2c facing the second source/drain region SD2. The third contact surface CS3 may include a third flat surface CS3a, and a third inclined surface CS3b extending from an end of the third flat surface CS3a so as to be inclined downward toward the substrate 100 and facing the second source/drain region SD2. According to the present embodiment, each of the flat surfaces may have a shorter length than the inclined surface adjacent thereto in one cross-sectional view. In other words, a length lp1 of the first flat surface CS1a may be shorter than a length ls1 of the first inclined surface CS1b, and a length lp2 of the second flat surface CS2a may be shorter than lengths ls2a and ls2b of the first and second sub-inclined surfaces CS2b and CS2c. Likewise, a length lp3 of third flat surface CS3a may be shorter than a length ls3 of the third inclined surface CS3b. In addition, the first sub-inclined surface CS2b and the second sub-inclined surface CS2c may be asymmetric (or inclined differently). In some embodiments, the length ls2b of the second sub-inclined surface CS2c may be greater than the length ls2a of the first sub-inclined surface CS2b. In some embodiments, a second inclined angle θ2 of the second-sub-inclined surface CS2c may be greater than a first inclined angle θ1 of the first sub-inclined surface CS2b. Here, an inclined angle may be defined as an angle between the respective inclined surface and a direction parallel to the top surface of the substrate 100.

According to some embodiments, the first to third contact surfaces CS1 to CS3 may include only inclined surfaces, as illustrated in FIG. 4B. In such embodiments, first and second sub-inclined surfaces CS2b and CS2c of the second contact surface CS2 may be asymmetric. In other words, in one cross-sectional view, the length ls2b of the second sub-inclined surface CS2c may be greater than the length ls2a of the first sub-inclined surface CS2b, and the second inclined angle θ2 of the second sub-inclined surface CS2c may be greater than the first inclined angle θ1 of the first sub-inclined surface CS2b.

According to some embodiments, as illustrated in FIG. 4C, contact surfaces of the third source/drain contact CT3 may be uneven or rounded. In some embodiments, the first and third contact surfaces CS1 and CS3 may have uneven curved surfaces, and the second contact surface CS2 may have a curved surface which is concave facing toward the third source/drain contact CT3. In this case, the second contact surface CS2 may be asymmetric. In some embodiments, the second contact surface CS2 may have a first curved surface CS2b and a second curved surface CS2c, and a length ls2b of the second curved surface CS2c may be greater than a length ls2a of the first curved surface CS2b. Here, the first curved surface CS2b may be defined as a portion of the second contact surface CS2 which extends from the apex of the second contact surface CS2 to an end of the second contact surface CS2 facing the first sub-source/drain region SD1a, and the second curved surface CS2c may be defined as another portion of the second contact surface CS2 which extends from the apex of the second contact surface CS2 to an opposite end of the second contact surface CS2 facing the second source/drain region SD2. The length of the curved surface according to one cross-sectional view may be defined as a length measured along a cross-sectional profile of the curved surface that overlaps the respective source/drain region.

According to some embodiments of the inventive concepts, since the third source/drain contact CT3 has the contact surfaces described above, contact areas between the third source/drain contact CT3 and the source/drain regions may be increased. As a result, contact resistances between the third source/drain contact CT3 and the source/drain regions may be reduced to improve electrical characteristics of the semiconductor device.

Referring to FIGS. 1, 2A, 2B, and 3A, a portion of the third source/drain contact CT3 may extend into the third recess region 127c. In other words, the third source/drain contact CT3 may include an extension EP that is disposed at a lower level than the contact surfaces CS1 to CS3 of the third source/drain contact CT3 and is disposed between the first and second active patterns AP1 and AP2 adjacent to each other. According to some embodiments, the extension EP may be in contact with the contact etch stop layer 125 disposed on a bottom surface BS3 of the third recess region 127c. In addition, the extension EP may be spaced apart from the sidewalls of the first and second active patterns AP1 and AP2 adjacent to each other. In other words, an insulating material (e.g., the contact etch stop layer 125 and the first interlayer insulating layer 130) may be disposed between the sidewall of the first active pattern AP1 and the extension EP and between the sidewall of the second active pattern AP2 and the extension EP.

Interconnections respectively connected to the first to third source/drain contacts CT1 to CT3 may be disposed on the second interlayer insulating layer 150. The interconnections may be electrically connected to the first and second source/drain regions SD1 and SD2 through the first to third source/drain contacts CT1 to CT3. The interconnections may include a conductive material.

Methods of manufacturing a semiconductor device according to example embodiments are described with reference to FIGS. 5A to 13A and 5B to 13B.

FIGS. 5A to 13A are cross-sectional views corresponding to the lines I-I' and II-II' of FIG. 1 to illustrate methods of manufacturing a semiconductor device according to example embodiments of the inventive concepts. FIGS. 5B to 13B are cross-sectional views corresponding to the lines and IV-IV' of FIG. 1 to illustrate methods of manufacturing a semiconductor device according to example embodiments of the inventive concepts.

Figure 5A:
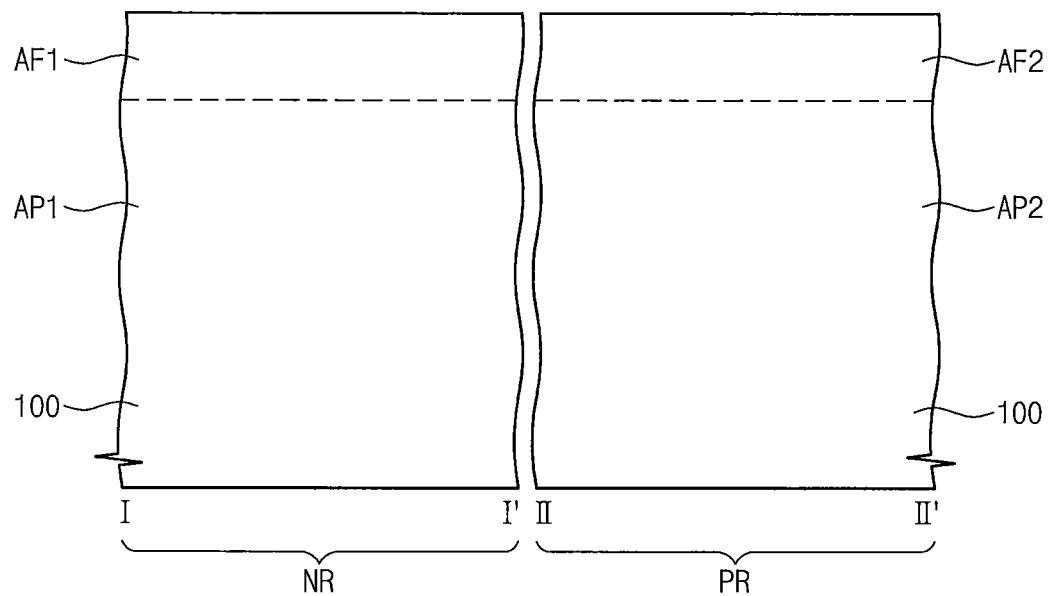
Figure 5B:
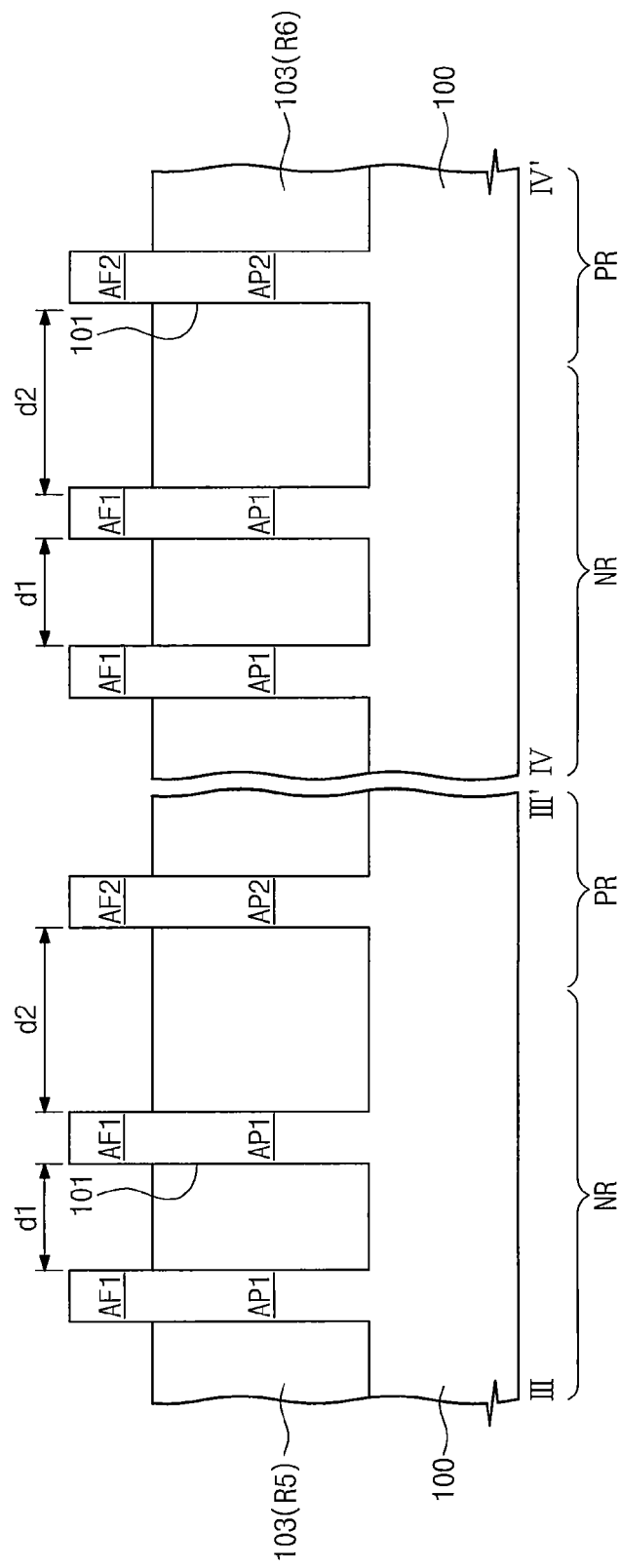

Referring to FIGS. 5A and 5B, a substrate 100 including an NMOSFET region NR and a PMOSFET region PR may be provided. The substrate 100 may be a semiconductor substrate. For example, the substrate 100 may be a silicon substrate, a germanium substrate, or a silicon-on-insulator (SOI) substrate. The NMOSFET region NR may be defined as an active region on which at least one N-type transistor is disposed, and the PMOSFET region PR may be defined as an active region on which at least one P-type transistor is disposed. The NMOSFET region NR and the PMOSFET region PR may be arranged along, for example, a first direction D1.

The substrate 100 may be patterned to form trenches 101 defining active patterns. The active patterns may include first active patterns AP1 disposed on the NMOSFET region NR, and a second active pattern AP2 disposed on the PMOSFET region PR. The first active patterns AP1 may be doped with P-type dopants, and the second active pattern AP2 may be doped with N-type dopants. The first active patterns AP1 and the second active pattern AP2 may be arranged along the first direction D1 and may extend in a second direction D2 intersecting the first direction D1. The first active patterns AP1 and the second active pattern AP1 may protrude from the substrate 100 in a direction perpendicular to a top surface of the substrate 100. According to some embodiments, the first active patterns AP1 may be spaced apart from each other by a first distance d1, and the second active pattern AP2 may be spaced apart from the first active pattern AP1 adjacent to the second active pattern AP2 by a second distance d2. The second distance d2 may be greater than the first distance d1. The NMOSFET region and the PMOSFET region have different conductivity types from each other, and the second distance d2 may be the minimum distance sufficient to isolate the NMOSFET region NR and the PMOSFET region PR from each other.

A device isolation pattern 103 may be formed in the trenches 101. The device isolation pattern 103 may be formed to expose upper portions of the first active patterns AP1 and an upper portion of the second active pattern AP2. The upper portions of the active patterns AP1 and AP2, which are exposed by the device isolation pattern 103, may be defined as first and second active fins AF1 and AF2, respectively.

Figure 6A:
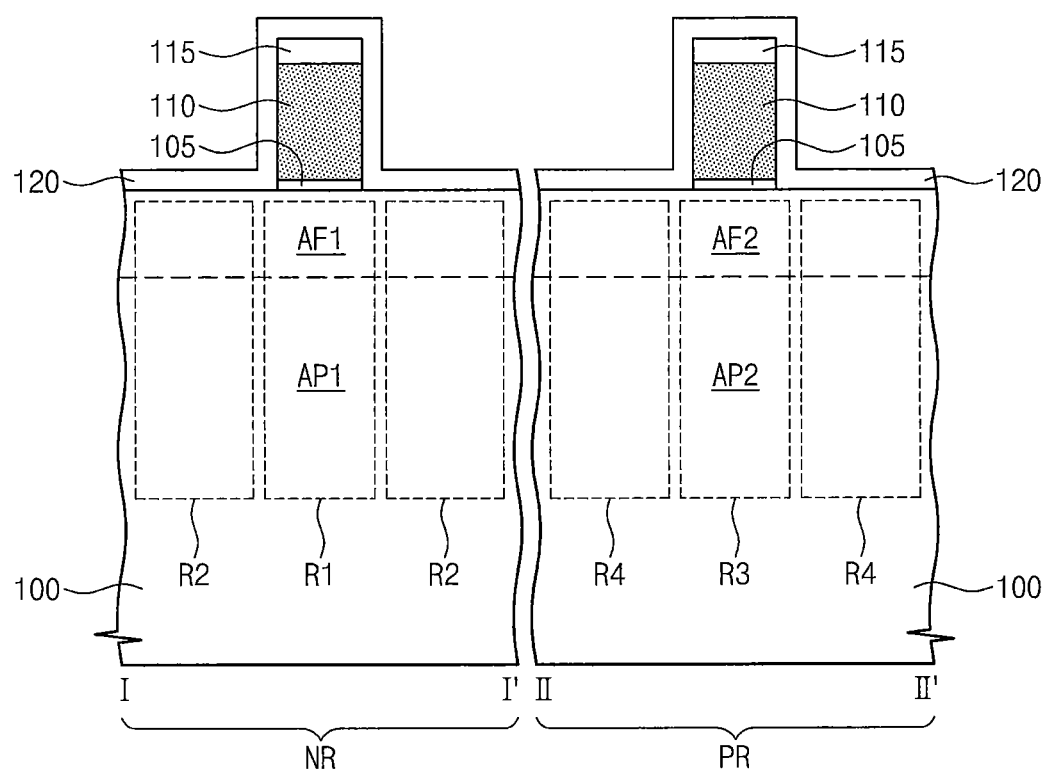
Figure 6B:
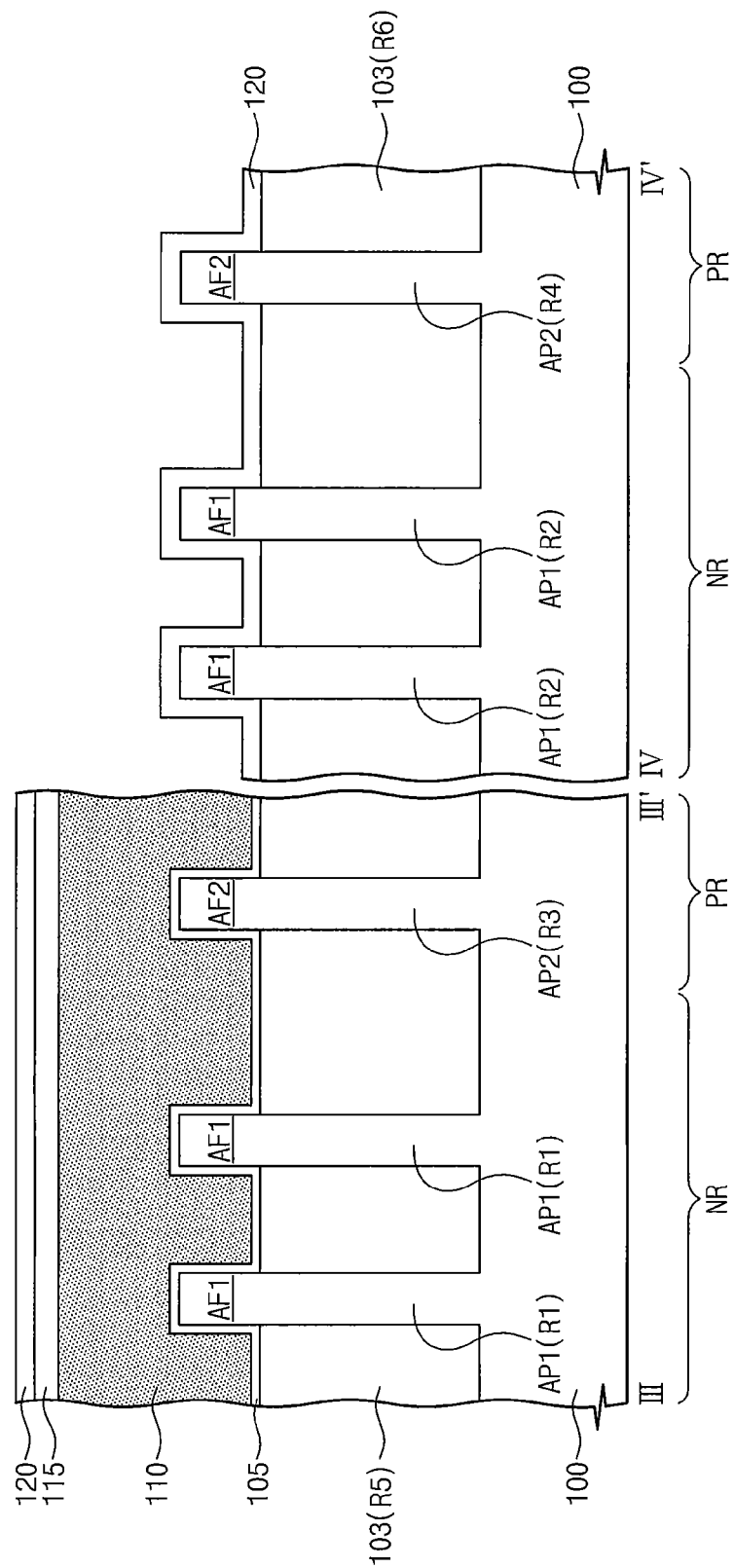

Referring to FIGS. 6A and 6B, a sacrificial gate structure may be formed on the substrate 100. The sacrificial gate structure may include an etch stop pattern 105, a sacrificial gate pattern 110, and a gate mask pattern 115 which are sequentially stacked on the substrate 100. The sacrificial gate structure may intersect the first active fins AF1 and the second active fin AF2. In other words, the etch stop pattern 105 and the sacrificial gate pattern 110 may cover top surfaces and sidewalls of the first and second active fins AF1 and AF2 and may extend onto a top surface of the device isolation pattern 103. The gate mask pattern 115 may be disposed on a top surface of the sacrificial gate pattern 110 to extend along the top surface of the sacrificial gate pattern 110. An etch stop layer, a sacrificial gate layer, and a gate mask layer may be sequentially formed on the substrate 100 to cover the active fins AF1 and AF2, and the etch stop layer, the sacrificial gate layer, and the gate mask layer may be patterned to form the sacrificial gate structure. The etch stop layer may include, for example, silicon oxide. The sacrificial gate layer may include a material having an etch selectivity with respect to the etch stop layer. For example, the sacrificial gate layer may include poly-silicon. The sacrificial gate layer may be formed by a chemical vapor deposition (CVD) process, a physical vapor deposition (PVD) process, or an atomic layer deposition (ALD) process. The gate mask layer may include a silicon nitride layer or a silicon oxynitride layer.

Since the sacrificial gate pattern 110 intersects the first active fins AF1 and the second active fin AF2, a first region R1 and second regions R2 may be defined in each of the first active patterns AP1, and a third region R3 and fourth regions R4 may be defined as in the second active region AP2. The first region R1 may correspond to a portion of the first active pattern AP1 which is disposed under the sacrificial gate pattern 110 and overlaps with the sacrificial gate pattern 110. The second regions R2 may correspond to other portions of the first active pattern AP1 which are disposed at both sides of the sacrificial gate pattern 110 and are horizontally spaced apart from each other by the first region R1. Likewise, the third region R3 may correspond to a portion of the second active pattern AP2 which is disposed under the sacrificial gate pattern 110 and overlaps with the sacrificial gate pattern 110. The fourth regions R4 may correspond to other portions of the second active pattern AP2 which are disposed at both sides of the sacrificial gate pattern 110 and are horizontally spaced apart from each other by the third region R3. In addition, a fifth region R5 and sixth regions R6 of the device isolation pattern 103 may be defined. The fifth region R5 may correspond to a portion of the device isolation pattern 103 which is disposed under the sacrificial gate pattern 110 and overlaps with the sacrificial gate pattern 110. The sixth regions R6 may correspond to other portions of the device isolation pattern 103 which are disposed at both sides of the sacrificial gate pattern 110 and are horizontally spaced apart from each other by the fifth region R5.

Next, a gate spacer layer 120 may be formed on the substrate 100 to conformally cover the sacrificial gate structure. In some embodiments, the gate spacer layer 120 may include silicon nitride. In some embodiments, the gate spacer layer 120 may include a low-k nitride such as SiCN or SiOCN. The gate spacer layer 120 may be formed by a deposition such as a CVD process or an ALD process.

Figure 7A:
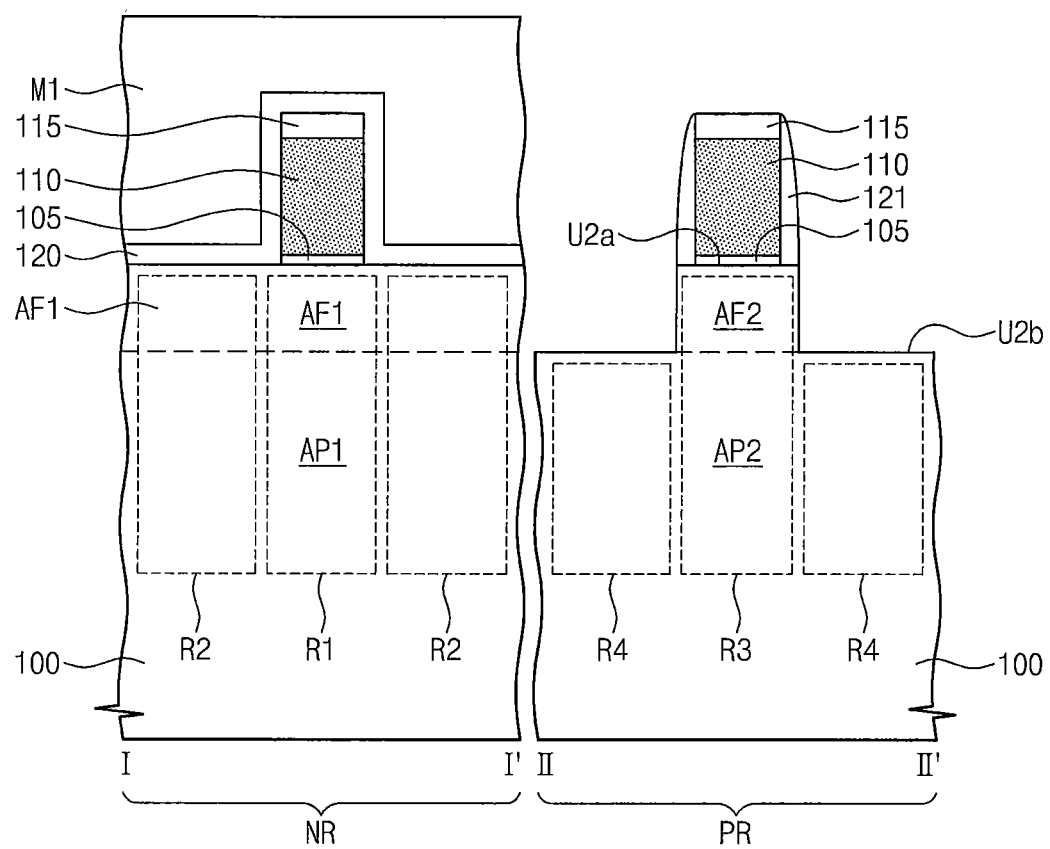
Figure 7B:
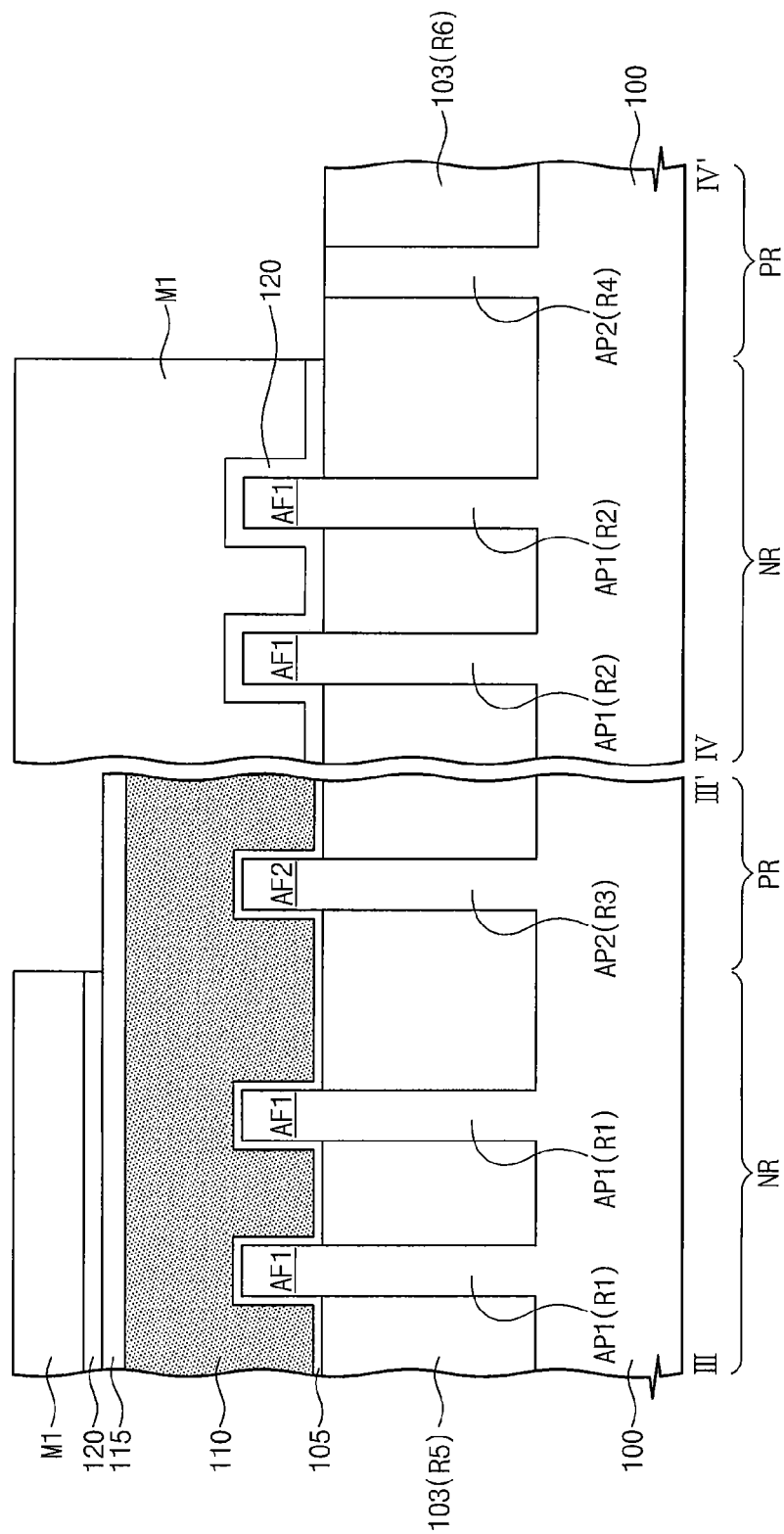

Referring to FIGS. 7A and 7B, a first mask pattern M1 may be formed to expose the PMOSFET region PR, and an etching process may be performed using the first mask pattern M1 as an etch mask. As a result, upper portions of the fourth regions R4 of the second active pattern AP2 may be removed. Thus, a height of top surfaces U2b of the fourth regions R4 of the second active pattern AP2 may be lower than a height of a top surface U2a of the third region R3. During the removal of the upper portions of the fourth regions R4, the gate spacers layer 120 exposed by the first mask pattern M1 may be etched to form a gate spacer 121 on a sidewall of the sacrificial gate pattern 110 of the PMOSFET region PR. Meanwhile, a top surface of the sacrificial gate pattern 110 exposed by the first mask pattern M1 may be protected by the gate mask pattern 115. The etching process for the removal of the upper portions of the fourth regions R4 may include a dry etching process and/or a wet etching process.

Figure 8A:
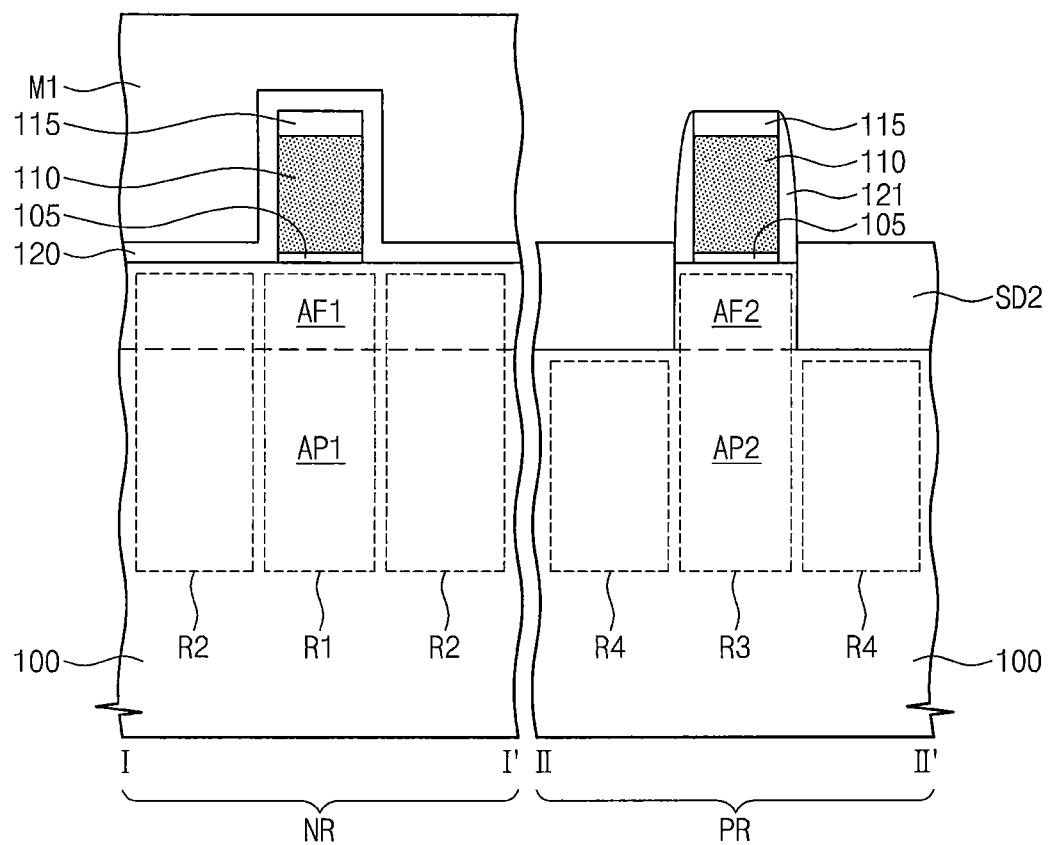
Figure 8B:
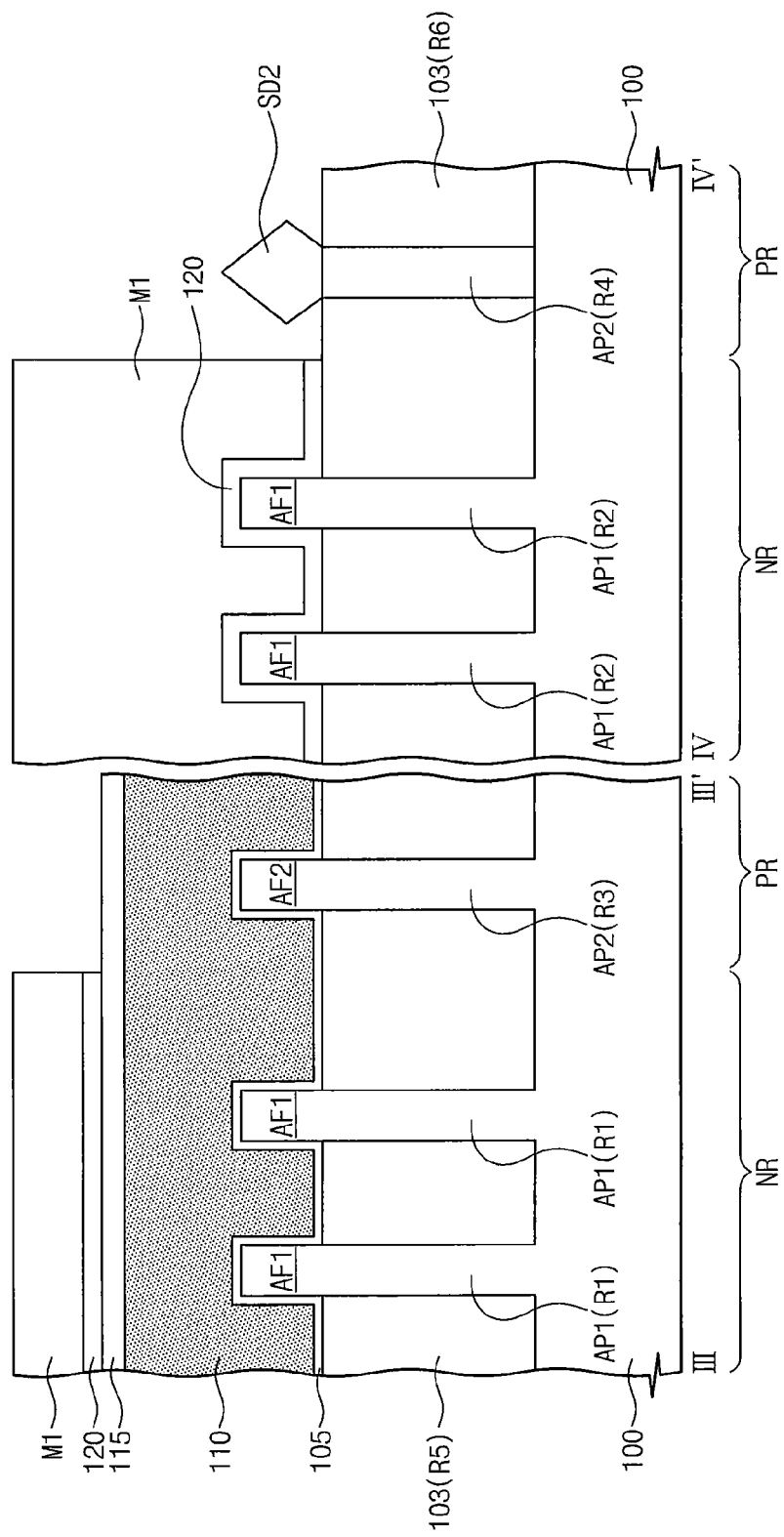

Referring to FIGS. 8A and 8B, second source/drain regions SD2 may be formed at both sides of the sacrificial gate pattern 110 of the PMOSFET region PR. The second source/drain regions SD2 may be formed on the fourth regions R4 of the second active pattern AP2. The second source/drain regions SD2 may be formed by performing a selective epitaxial growth (SEG) process. In other words, the second source/drain regions SD2 may be epitaxial patterns grown using the top surfaces U2b of the fourth regions R4 as seeds. The second source/drain regions SD2 may be formed to provide a compressive strain to a second channel region CH2. In some embodiments, if the substrate 100 is a silicon substrate, the second source/drain regions SD2 may be formed of silicon-germanium (SiGe) layers. However, the inventive concepts are not limited thereto. The second source/drain regions SD2 may be doped with dopants during or after the SEG process. The second source/drain regions SD2 may be doped with P-type dopants. After the formation of the second source/drain regions SD2, the first mask pattern M1 may be removed.

Figure 9A:
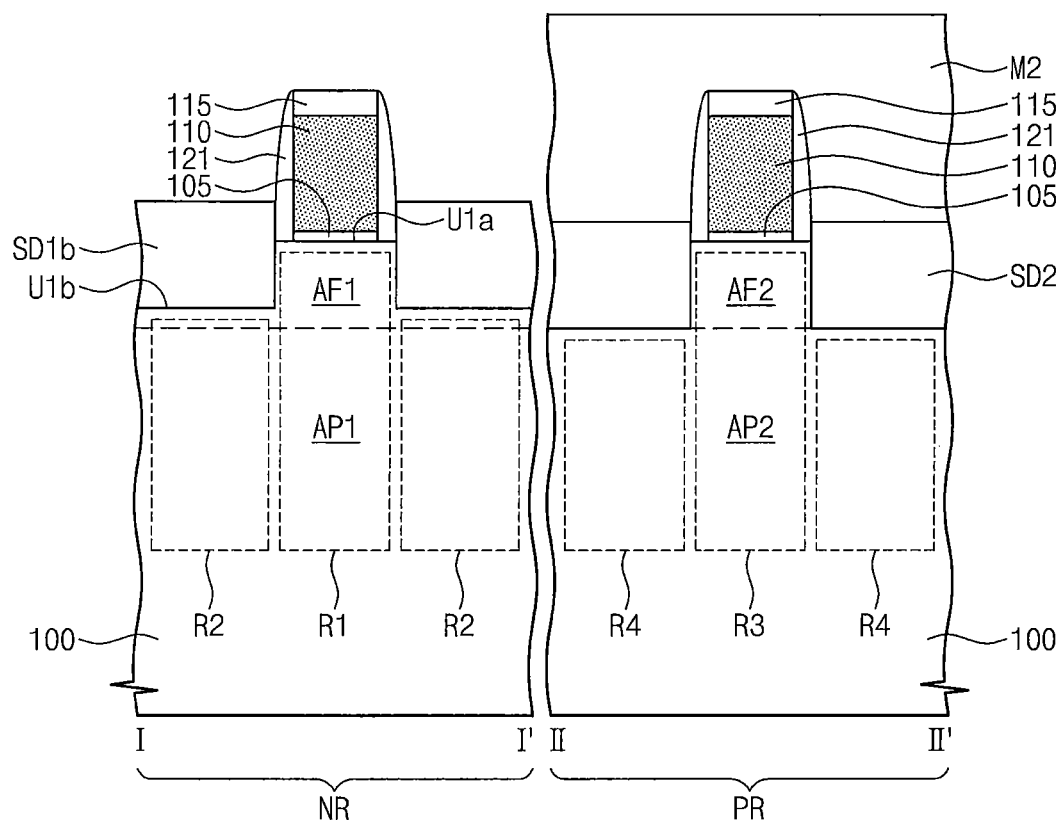
Figure 9B:
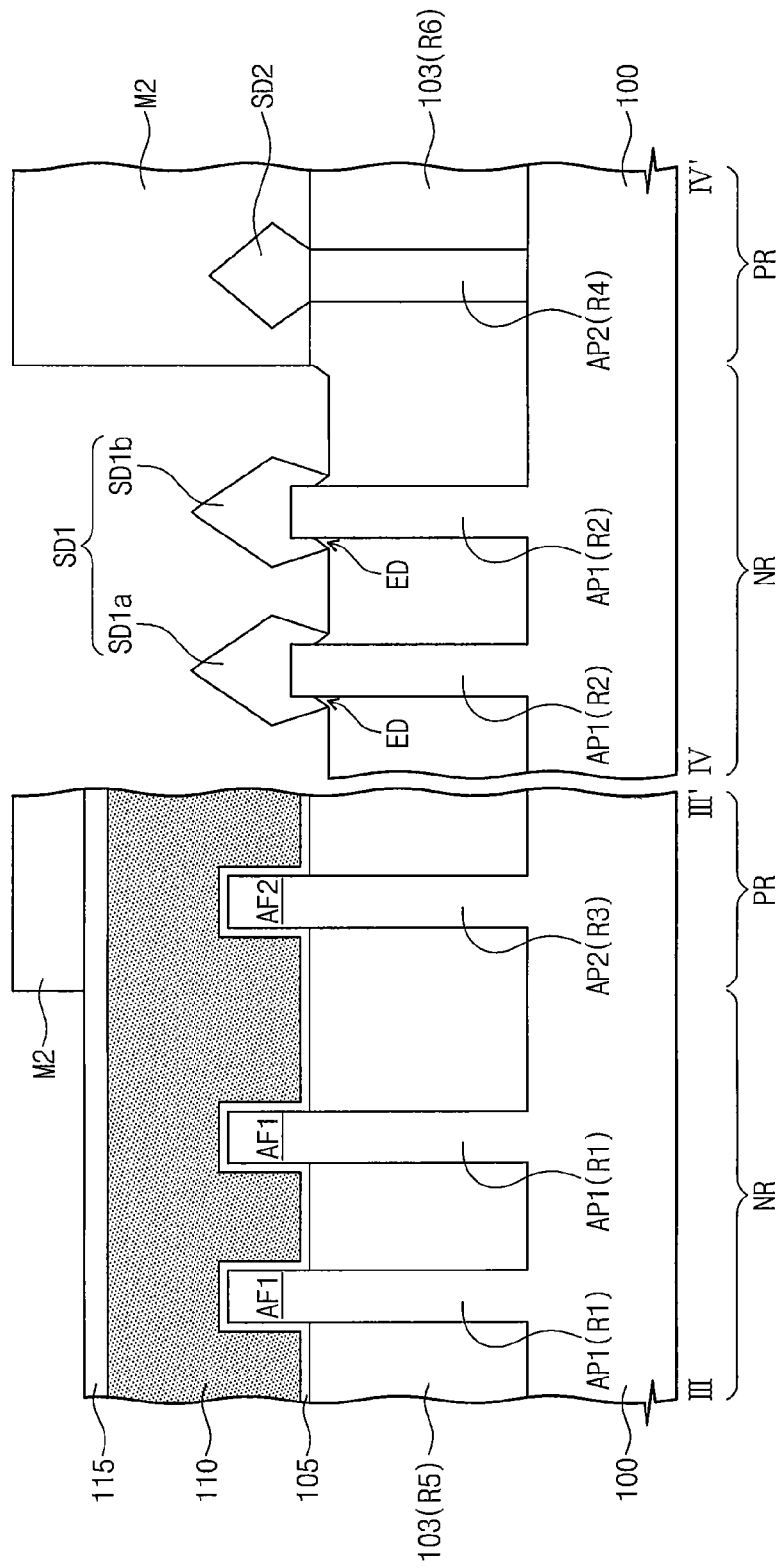

Referring to FIGS. 9A and 9B, a second mask pattern M2 may be formed to expose the NMOSFET region NR, and an etching process may be performed using the second mask pattern M2 as an etch mask. As a result, upper portions of the second regions R2 of the first active patterns AP1 may be removed. Thus, a height of top surfaces U1b of the second regions R2 of the first active patterns AP1 may be lower than a height of top surfaces U1a of the first regions R1 of the first active patterns AP1. According to some embodiments, an etched amount of the removed upper portion of the second region R2 may be less than that of the removed upper portion of the fourth region R4 of the second active pattern AP2. Thus, the height of the top surfaces U1b of the second regions R2 may be higher than the top surfaces U2b of the fourth regions R4. During the removal of the upper portions of the second regions R2, the gate spacer 120 exposed by the second mask pattern M2 may be removed to form a gate spacer 121 on a sidewall of the sacrificial gate pattern 110 of the NMOSFET region NR.

Thereafter, an upper portion of the device isolation pattern 103 exposed by the second mask pattern M2 may be recessed. As a result, sidewalls of the second regions R2 of the first active patterns AP1 may be partially exposed. The device isolation pattern 103 may be recessed using a wet etching process. During the recess of the device isolation pattern 103, portions of the device isolation pattern 103 may remain on both sidewalls of the second regions R2 to form edge portions ED.

A selective epitaxial growth (SEG) process may be performed using the top surfaces U1b and the exposed sidewalls of the second regions R2 as seeds to form first source/drain regions SD1 at both sides of the sacrificial gate pattern 110 of the NMOSFET region NR. In other words, the first source/drain regions SD1 may be epitaxial patterns. The first source/drain regions SD1 may include first and second sub-source/drain regions SD1a and SD1b which are formed on the first active patterns AP1, respectively. The uppermost ends (or apexes) of the first and second sub-source/drain regions SD1a and SD1b may be higher than the uppermost ends of the second source/drain regions SD2. This is because the height of the top surfaces U1b of the second regions R2 is higher than that of the top surfaces U2b of the fourth regions R4 and growth amounts of the first and second sub-source/drain regions SD1a and SD1b are adjusted during the SEG process. Meanwhile, due to the edge portions ED, the lowermost ends of the first and second sub-source/drain regions SD1a and SD1b may be spaced apart from the sidewalls of the second regions R2.

The first and second sub-source/drain regions SD1a and SD1b may be formed to provide a tensile strain to first channel regions CH1. In some embodiments, if the substrate 100 is a silicon substrate, the first and second sub-source/drain regions SD1a and SD1b may be formed of silicon layers or silicon carbide (SiC) layers. However, the inventive concepts are not limited thereto. The first and second sub-source/drain regions SD1a and SD1b may be doped with dopants during or after the SEG process. The first and second sub-source/drain regions SD1a and SD may be doped with N-type dopants.

Figure 10A:
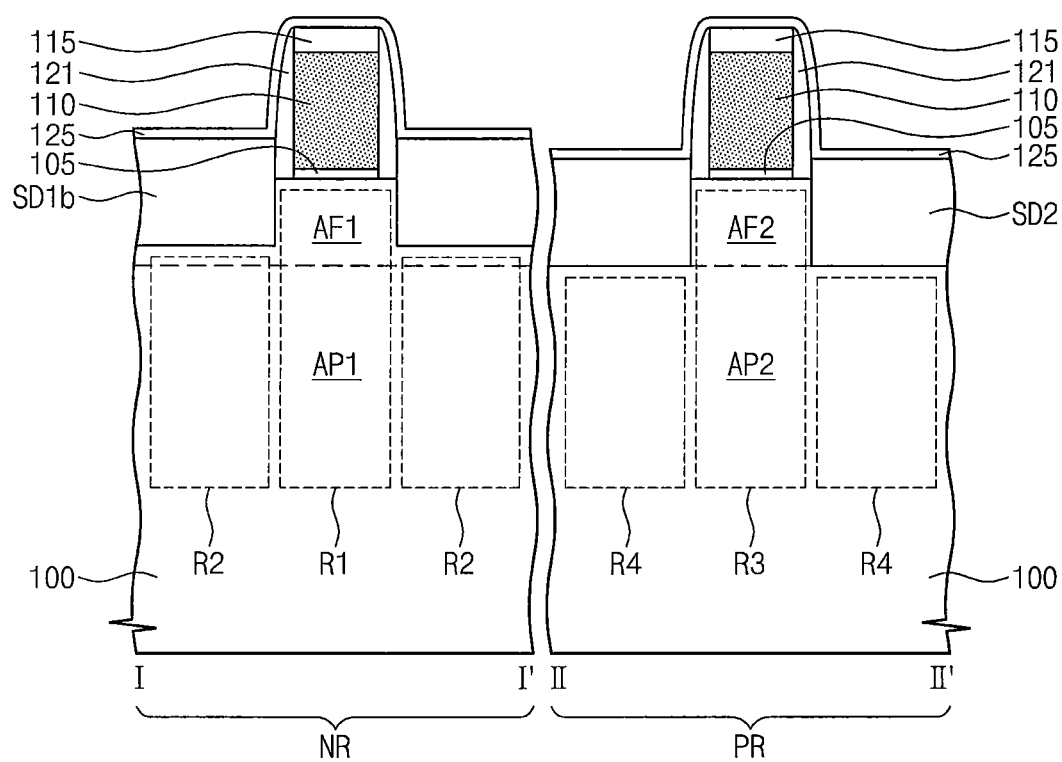
Figure 10B:
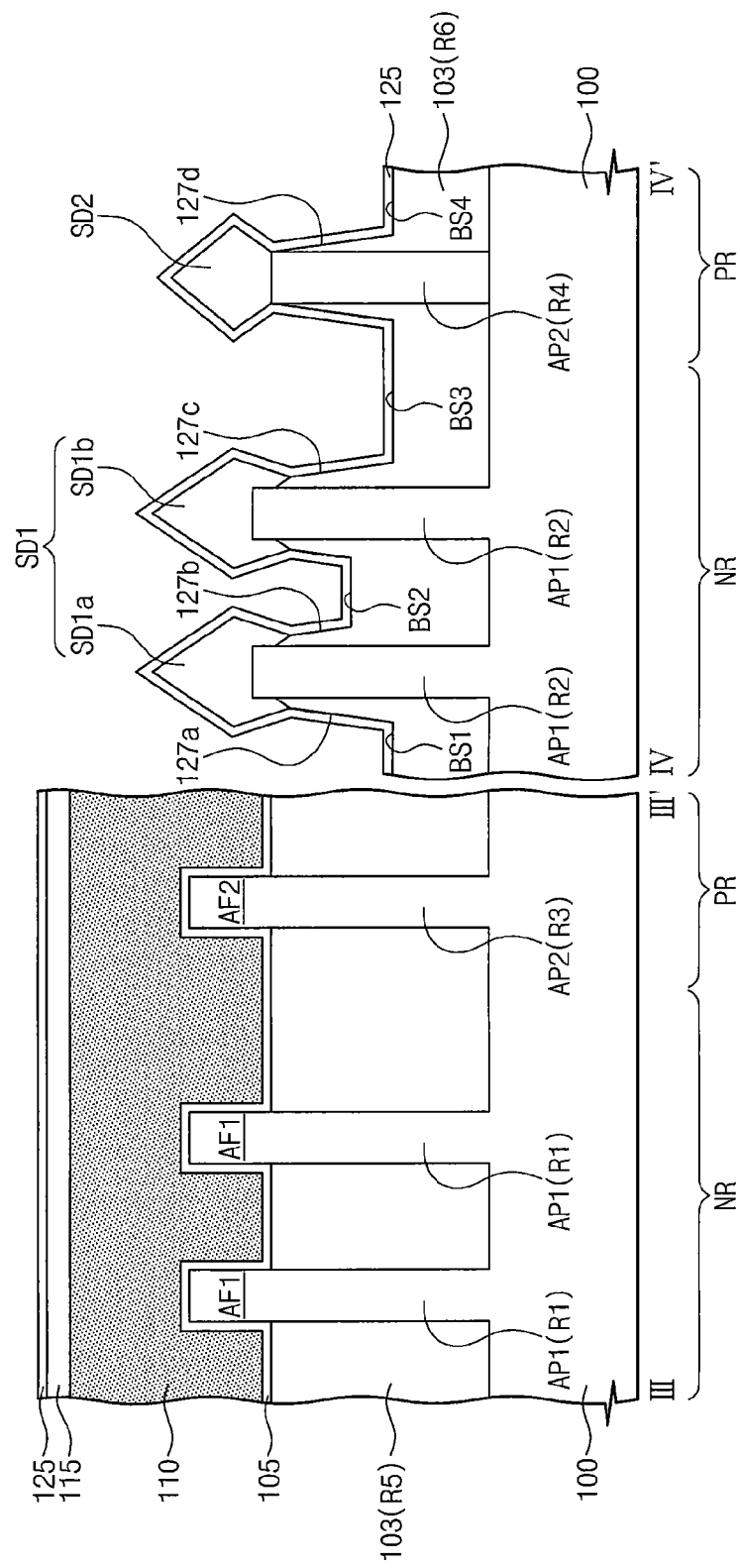

Referring to FIGS. 10A and 10B, the second mask pattern M2 may be removed after the formation of the first source/drain regions SD1. Thereafter, upper portions of the sixth regions R6 of the device isolation pattern 103 may be recessed. As a result, a plurality of recess regions may be formed in the sixth regions R6 of the device isolation pattern 103. The plurality of recess regions may be defined in the recessed upper portions of the sixth regions R6. In some embodiments, the plurality of recess regions may include a first recess region 127a disposed at a side of the first active patterns AP1, a second recess region 127b disposed between the first active patterns AP1, a third recess region 127c disposed between the second active pattern AP2 and the first active pattern AP1 adjacent to the second active pattern AP2, and a fourth recess region 127d disposed at an opposite side of the second active pattern AP2. The first active patterns AP1, the second active pattern AP2, and the second and third recess regions 127b and 127c may be disposed between the first recess region 127a and the fourth recess region 127d. A recessed depth of a recess region may be varied depending on a density of patterns. In other words, a recess region between active patterns arranged at a relatively narrow interval may be shallower than a recess region between active patterns arranged at a relatively wide interval. For example, a bottom surface BS2 of the second recess region 127b may be higher than bottom surfaces BS1, BS3, and BS4 of the first, third, and fourth recess regions 127a, 127c, and 127d. In some embodiments, sidewalls of the fourth regions R4 of the second active pattern AP2 may not be exposed during the recess of the sixth regions R6. In some embodiments, the sidewalls of the fourth regions R4 of the second active pattern AP2 may also be exposed during the recess of the sixth regions R6.

Thereafter, a contact etch stop layer 125 may be conformally formed on the substrate 100. The contact etch stop layer 125 may cover inner surfaces of the recess regions of the device isolation pattern 103 may extend onto the first and second source/drain regions SD1 and SD2 and the gate mask pattern 115. The contact etch stop layer 125 may be formed of a material having an etch selectivity with respect to a first interlayer insulating layer 130. For example, the contact etch stop layer 125 may include a silicon nitride layer and/or a silicon oxynitride layer. The contact etch stop layer 125 may be formed by a CVD process or an ALD process.

Figure 11A:
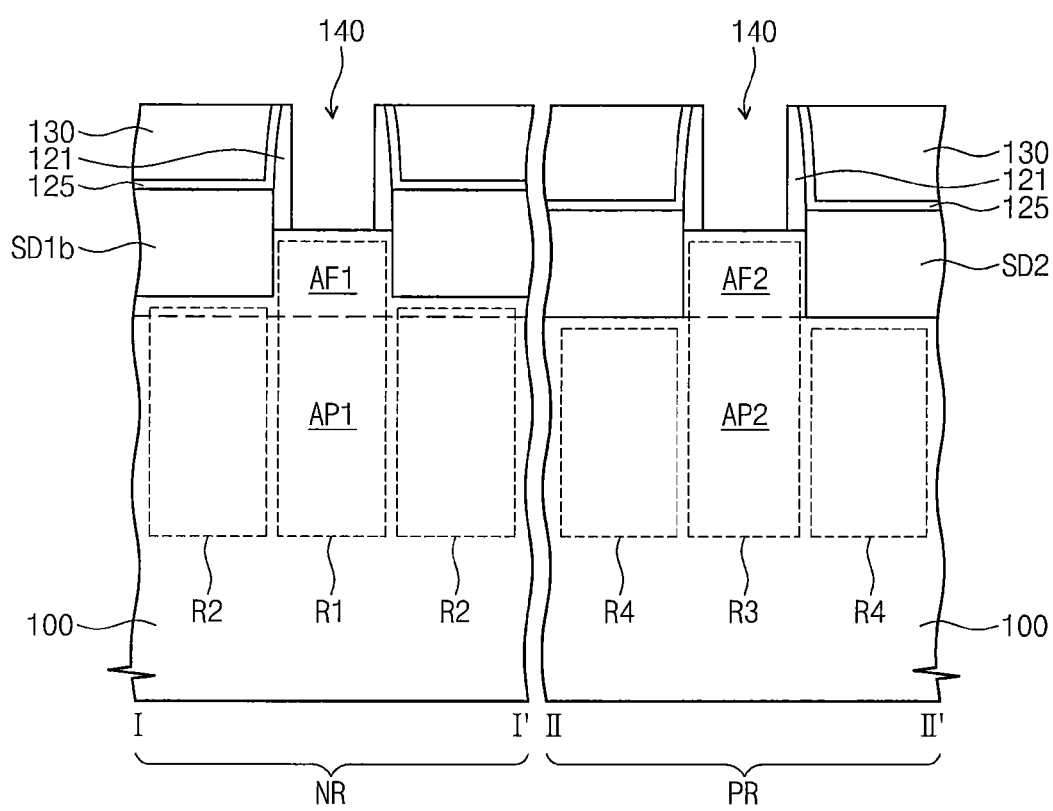
Figure 11B:
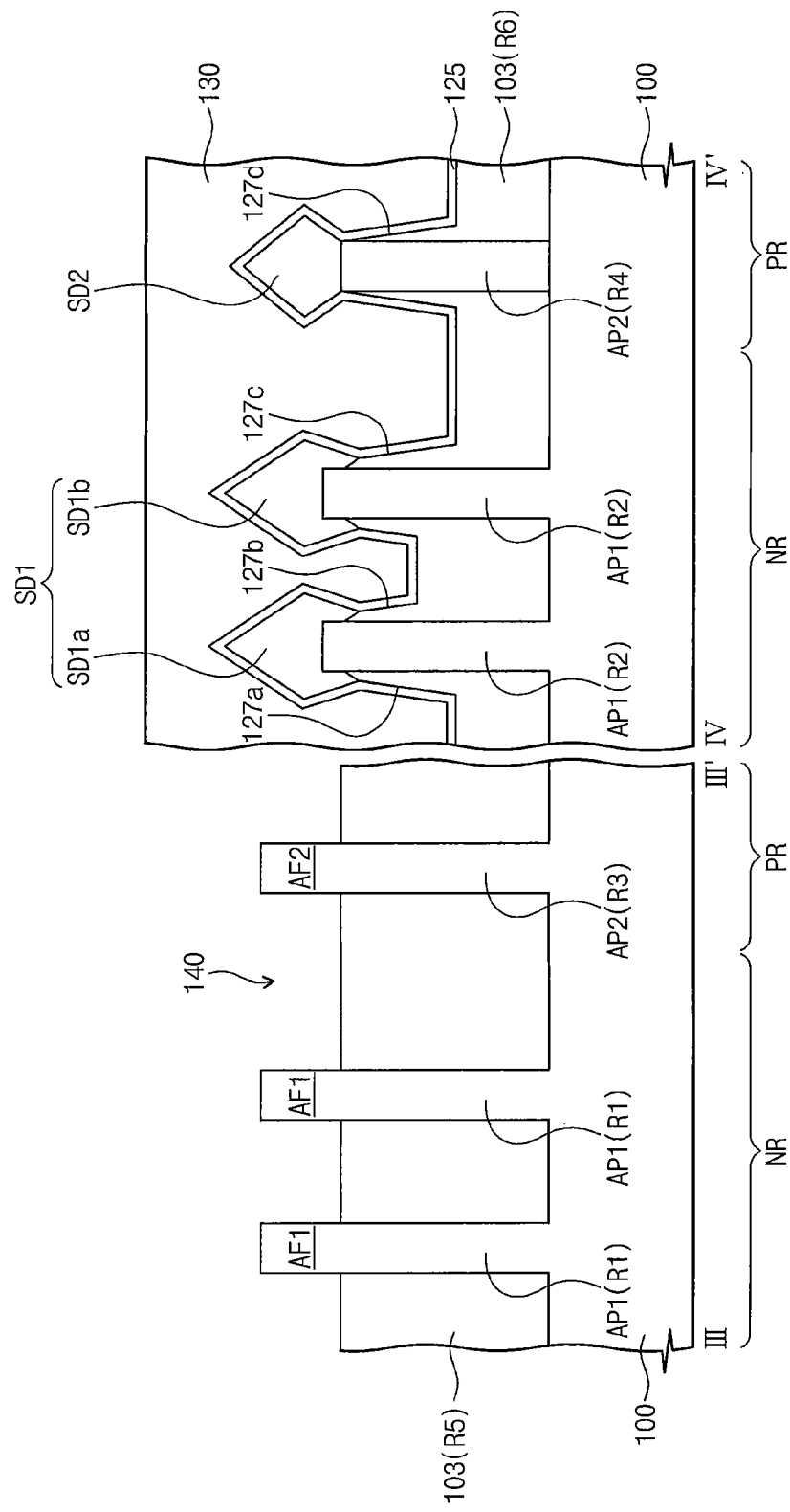

Referring to FIGS. 11A and 11B, the first interlayer insulating layer 130 may be formed on the substrate 100 having the contact etch stop layer 125. The first interlayer insulating layer 130 may be formed to cover the first and second source/drain regions SD1 and SD2 and the sacrificial gate pattern 110. The first interlayer insulating layer 130 may include at least one of a silicon oxide layer or low-k dielectric layers.

Next, a process of planarizing the first interlayer insulating layer 130 may be performed until the top surface of the sacrificial gate pattern 110 is exposed. The planarization process may include an etch-back process and/or a chemical mechanical polishing (CMP) process. The exposed sacrificial gate pattern 110 may be removed to form a gap region 140 exposing the first and second active fins AF1 and AF2 between the gate spacers 121. The gap region 140 may be formed by performing an etching process of selectively removing the sacrificial gate pattern 110 and the etch stop pattern 105.

Figure 12A:
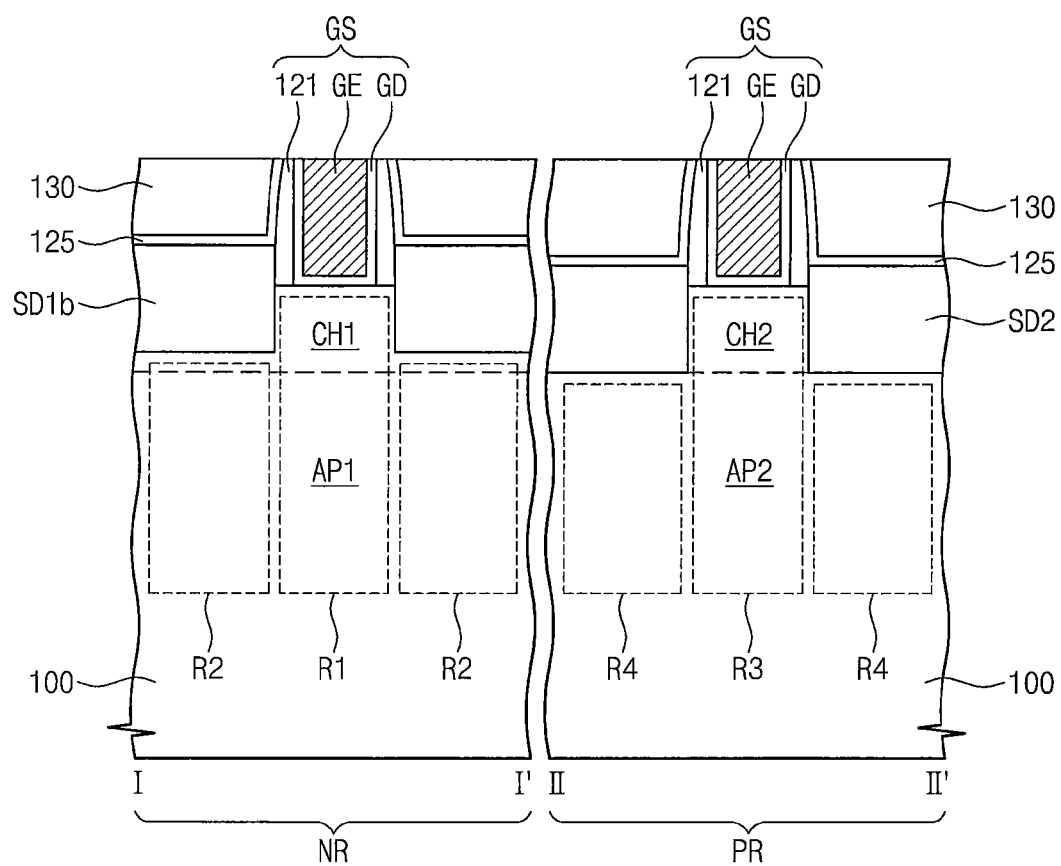
Figure 12B:
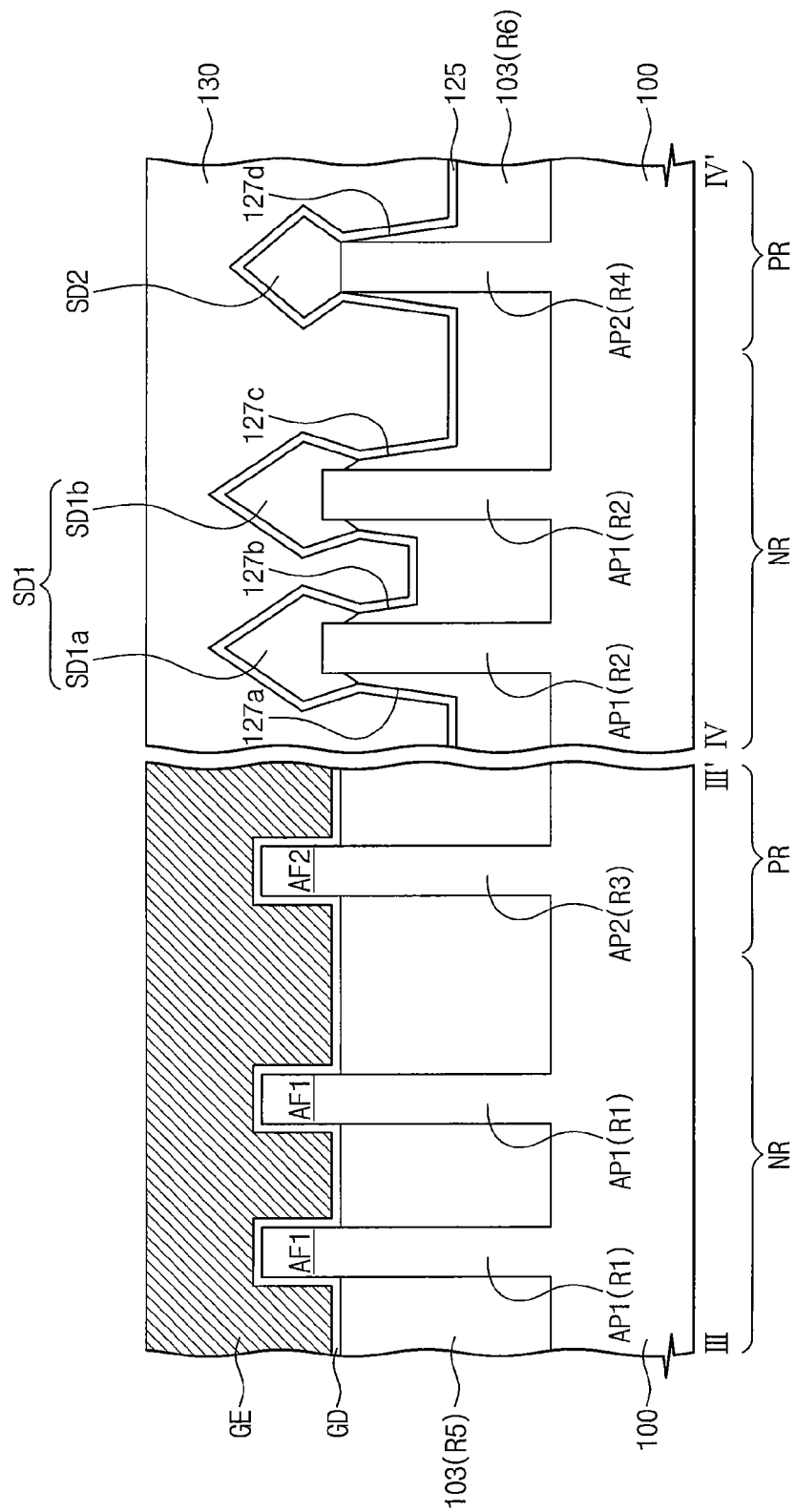

Referring to FIGS. 12A and 12B, a gate dielectric pattern GD and a gate electrode GE may be formed to fill the gap region 140. In detail, a gate dielectric layer may be formed on the substrate 100 having the gap region 140 to partially fill the gap region 140. The gate dielectric layer may be formed to cover the first and second active fins AF1 and AF2. The gate dielectric layer may include at least one of high-k dielectric layer. For example, the gate dielectric layer may include at least one of, but not limited to, hafnium oxide, hafnium silicate, zirconium oxide, or zirconium silicate. The gate dielectric layer may be formed by performing, for example, an ALD process. A gate layer may be formed on the gate dielectric layer to fill the rest portion of the gap region 140. The gate layer may include at least one of a conductive metal nitride (e.g., titanium nitride or tantalum nitride) or a metal (e.g., aluminum or tungsten). The gate dielectric layer and the gate layer which are sequentially stacked may be planarized to the gate dielectric pattern GD and the gate electrode GE. Top surfaces of the first interlayer insulating layer 130 and the gate spacers 121 may be exposed by the planarization process performed on the gate layer and the gate dielectric layer. The gate dielectric pattern GD may extend along a bottom surface of the gate electrode GE and may be disposed on both sidewalls of the gate electrode GE so as to be disposed between the gate electrode GE and the gate spacer 121.

The first and second active fins AF1 and AF2 disposed under the gate electrode GE may be defined as the first and second channel regions CH1 and CH2, respectively. Each of the first channel regions CH1 may be disposed between the first sub-source/drain regions SD1a or between the second sub-source/drain regions SD1b, and the second channel region CH2 may be disposed between the second source/drain regions SD2. The gate dielectric pattern GD, the gate electrode GE, and the gate spacer 121 may constitute a gate structure GS.

Figure 13A:
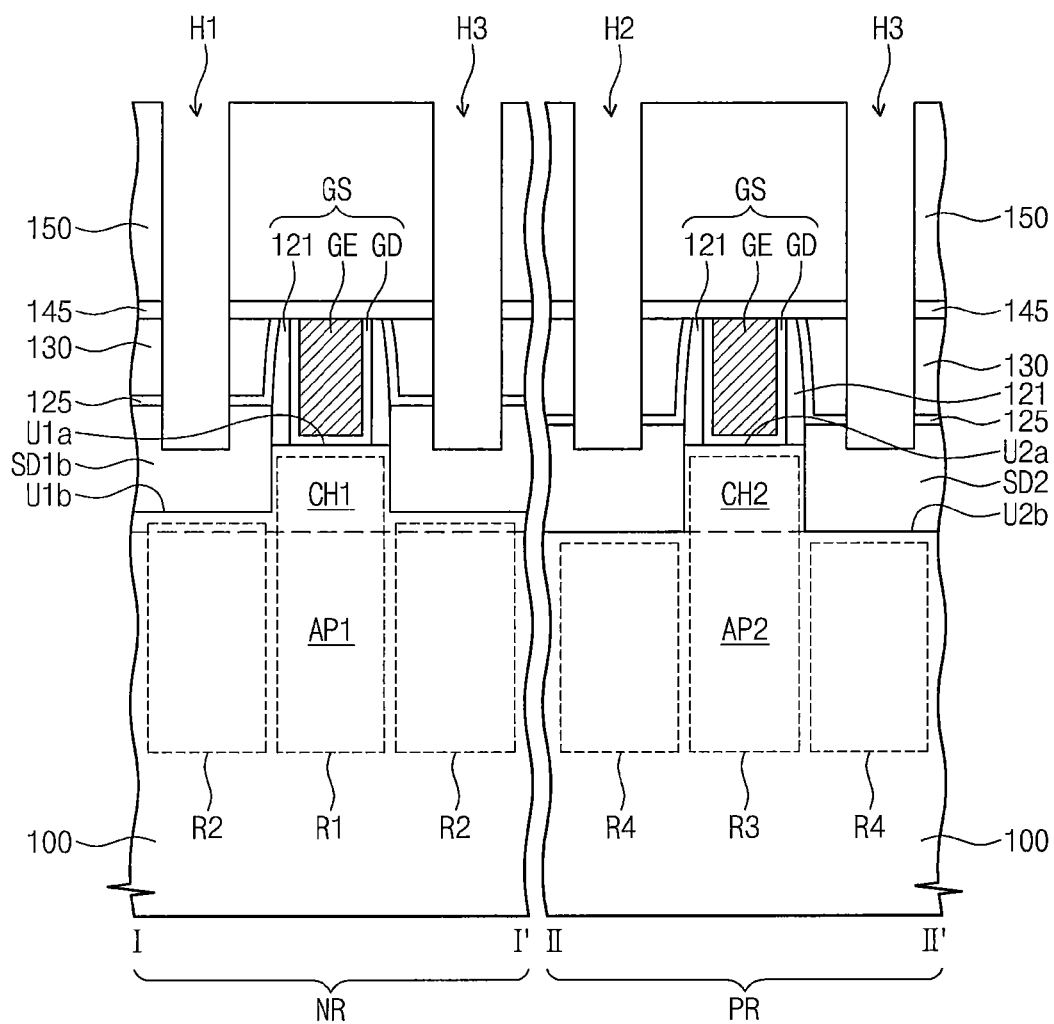
Figure 13B:
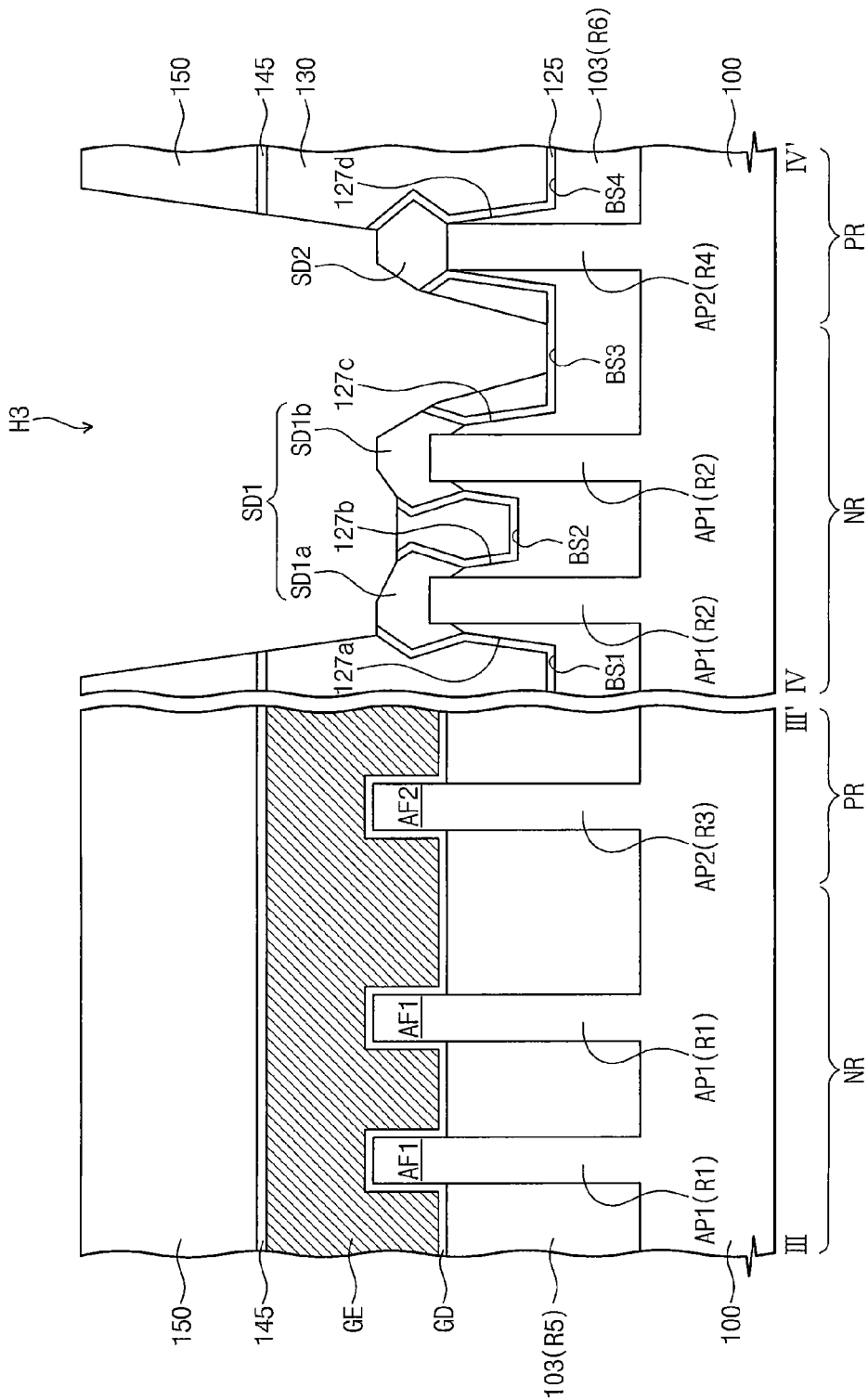

Referring to FIGS. 13A and 13B, a gate capping layer 145 and a second interlayer insulating layer 150 may be sequentially formed on the resultant structure including the gate electrode GE. The gate capping layer 145 may cover the gate structure GS and the first interlayer insulating layer 130. The gate capping layer 145 may include, for example, a silicon nitride layer. The second interlayer insulating layer 150 may include at least one of a silicon oxide layer, a silicon nitride layer, a silicon oxynitride layer, or low-k dielectric layers. Each of the gate capping layer 145 and the second interlayer insulating layer 150 may be formed by, for example, a CVD process.

Next, first to third contact holes H1 to H3 may be formed to penetrate the second interlayer insulating layer 150, the gate capping layer 145, the first interlayer insulating layer 130, and the contact etch stop layer 125. The first to third contact holes H1 to H3 may expose the first and second source/drain regions SD1 and SD2. The first contact hole H1 may expose the first and second sub-source/drain regions SD1a and SD1b disposed at one side of the gate structure GS, and the second contact hole H2 may expose the second source/drain region SD2 disposed at the one side of the gate structure GS. The third contact hole H3 may expose the first and second sub-source/drain regions SD1a and SD1b and the second source/drain region SD2 which are disposed at the opposite side of the gate structure GS. A mask pattern may be formed on the second interlayer insulating layer 150, and then, an anisotropic etching process may be performed using the mask pattern an etch mask to form the first to third contact holes H1 to H3.

According to the inventive concepts, the anisotropic etching process may be performed to further etch upper portions of the first and second sub-source/drain regions SD1a and SD1b and the second source/drain regions SD2 which are exposed by the first to third contact holes H1 to H3. Thus, each of the first and second sub-source/drain regions SD1a and SD and the second source/drain regions SD2 may have a flat surface substantially parallel to the top surface of the substrate 100 and an inclined surface. At this time, the first interlayer insulating layer 130 between the second sub-source/drain region SD1b and the second source/drain region SD2 may be etched more than the first interlayer insulating layer 130 between the first and second sub-source/drain regions SD1a and SD1b by different amounts due to the difference in the density of the patterns. In some embodiments, the anisotropic etching process may be performed until the contact etch stop layer 125 disposed on the bottom surface BS3 of the third recess region 127c is exposed. Meanwhile, shapes of the top surfaces of the first and second sub-source/drain regions SD1a and SD1b and the second source/drain regions SD2 exposed by the first to third contact holes H1 to H3 may be variously realized according to an etching degree of the anisotropic etching process. In some embodiments, the top surfaces of the source/drain regions SD1a, SD1b, and SD2 may be variously formed to correspond to the first to third contact surfaces CS1 to CS3 of FIG. 4A, 4B, or 4C.

Referring again to FIGS. 2A and 2B, first, second, and third source/drain contacts CT1, CT2, and CT3 may be formed in the first, second, and third contact holes H1, H2, and H3 of FIGS. 13A and 13B, respectively. In more detail, a conductive material layer may be formed on the substrate 100 to fill the first to third contact holes H1 to H3, and then, the conductive material layer may be planarized until the top surface of the second interlayer insulating layer 150 is exposed to provide the first to third source/drain contacts CT1, CT2, and CT3. In some embodiments, forming the conductive material layer may include sequentially depositing a first conductive layer 160 and a second conductive layer 165. The first conductive layer 160 may be a barrier conductive layer. For example, the first conductive layer 160 may include at least one of a titanium nitride layer, a tungsten nitride layer, or a tantalum nitride layer. The second conductive layer 165 may be a metal layer. For example, the second conductive layer 165 may include at least one of tungsten, titanium, or tantalum. After the formation of the first conductive layer 160, a thermal treatment process may be performed to form a metal silicide layer between the first conductive layer 160 and each of the source/drain regions SD1a, SD1b, and SD2. For example, the metal silicide layer may include at least one of titanium silicide, tantalum silicide, or tungsten silicide.

Interconnections may be formed on the second interlayer insulating layer 150 so as to be connected to the first to third source/drain contacts CT1 to CT3, respectively. The interconnections may include a conductive material.

Figure 14:
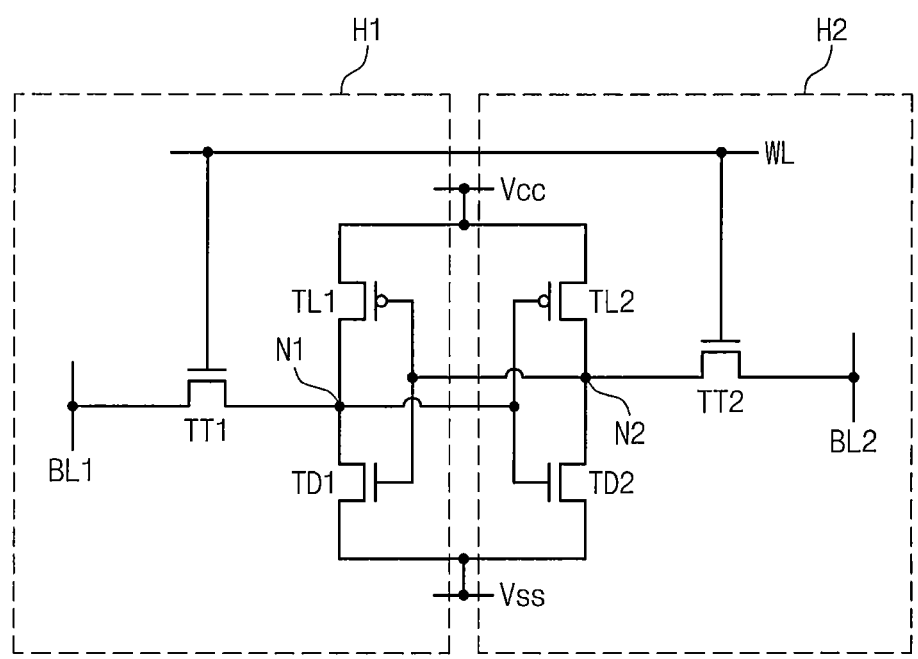
FIG. 14 is an equivalent circuit diagram of a complementary metal-oxide-semiconductor static random access memory cell (CMOS SRAM cell) including a field effect transistor according to example embodiments of the inventive concepts.

FIG. 14 is an equivalent circuit diagram of a complementary metal-oxide-semiconductor static random access memory cell (CMOS SRAM cell) including a field effect transistor according to example embodiments of the inventive concepts. Referring to FIG. 14, a CMOS SRAM cell may include a pair of driver transistors TD1 and TD2, a pair of transfer transistors TT1 and TT2, and a pair of load transistors TL1 and TL2. The driver transistors TD1 and TD2 may correspond to pull-down transistors, the transfer transistors TT1 and TT2 may correspond to pass transistors, and the load transistors TL1 and TL2 may correspond to pull-up transistors. The driver transistors TD1 and TD2 and the transfer transistors TT1 and TT2 may be NMOS transistors, and the load transistors TL1 and TL2 may be PMOS transistors. The first transistor TR1 of FIG. 1 according to the embodiments of the inventive concepts may be one of the driver transistors TD1 and TD2 and the transfer transistors TT1 and TT2, and the second transistor TR2 of FIG. 1 may be one of the driver transistors TL1 and TL2.

The first driver transistor TD1 and the first transfer transistor TT1 may be in series with each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be in series with each other. A source region of the second driver transistor TD2 may be electrically connected to the ground line Vss, and a drain region of the second transfer transistor TT2 may be electrically connected to a second bit line BL2.

A source region and a drain region of the first load transistor TL1 may be electrically connected to a power line Vcc and a drain region of the first driver transistor TD1, respectively. A source region and a drain region of the second load transistor TL2 may be electrically connected to the power line Vcc and a drain region of the second driver transistor TD2, respectively. A drain region of the first load transistor TL1, the drain region of the first driver transistor TD1, and a source region of the first transfer transistor TT1 may correspond to a first node N1. A drain region of the second load transistor TL2, the drain region of the second driver transistor TD2, and a source region of the second transfer transistor TT2 may correspond to a second node N2. A gate electrode of the first driver transistor TD1 and a gate electrode of the first load transistor TL1 may be electrically connected to the second node N2, and a gate electrode of the second driver transistor TD2 and a gate electrode of the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half-cell H1, and the second driver transistor TD2, the second transfer transistor TT2, and the second load transistor TL2 may constitute a second half-cell H2.

Figure 15:
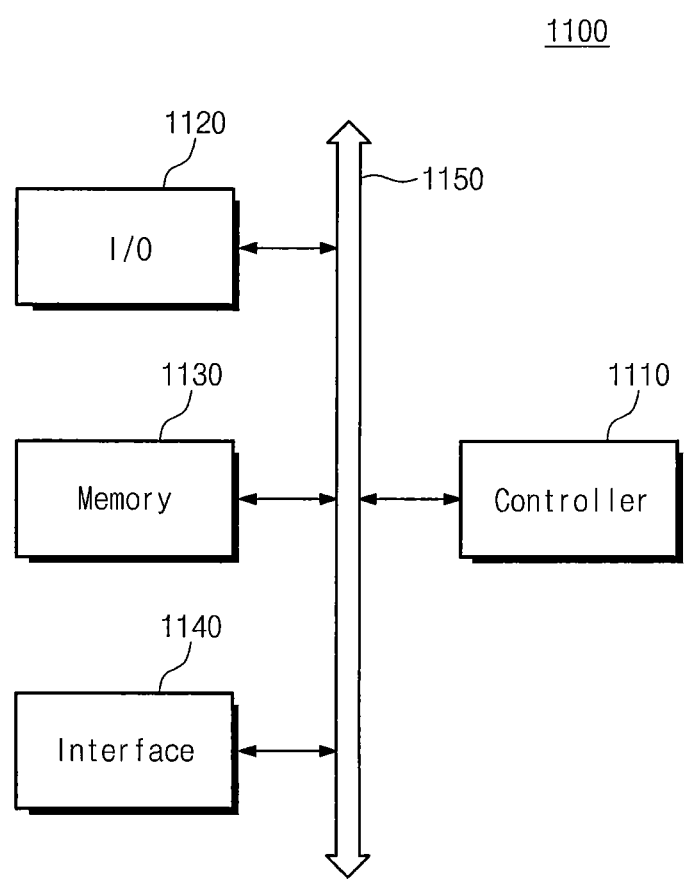
FIG. 15 is a block diagram illustrating an electronic system including a semiconductor device according to embodiments of the inventive concepts.

FIG. 15 is a block diagram illustrating an electronic system including a semiconductor device according to embodiments of the inventive concepts.

Referring to FIG. 15, an electronic system 1100 according to an embodiment of the inventive concept may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate wirelessly or over a cable. For example, the interface unit 1140 may include an antenna or a wireless/cable transceiver. The electronic system 1100 may further include a fast dynamic random access memory (DRAM) device and/or a fast static random access memory (SRAM) device which acts as a cache memory for improving an operation of the controller 1110. At least one of the semiconductor devices according to the aforementioned embodiments of the inventive concepts may be provided in the memory device or may be provided in the controller 1110, the interface unit 1140, and/or the I/O 1120.

The electronic system 1100 may be applied to a personal digital assistant (PDA), a portable computer, a web tablet, a wireless phone, a mobile phone, a digital music player, a memory card, or other electronic products receiving or transmitting information data wirelessly. The electronic system 1100 of FIG. 15 may be applied to electronic control systems of various electronic devices.

Figure 16:
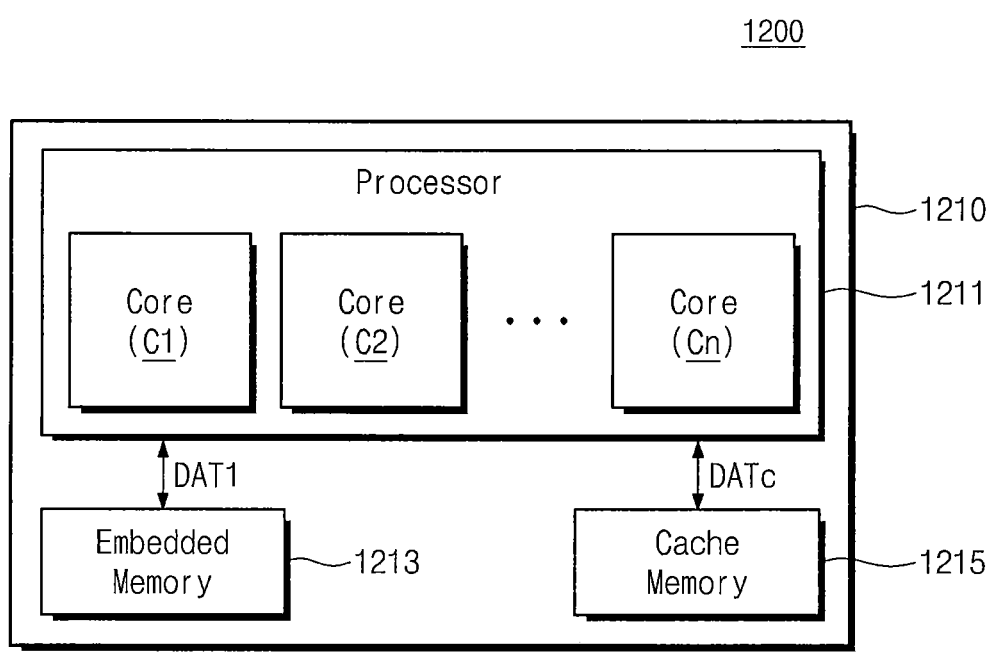
FIG. 16 is a block diagram illustrating an electronic device including a semiconductor device according to embodiments of the inventive concepts.

FIG. 16 is a block diagram illustrating an electronic device including a semiconductor device according to embodiments of the inventive concepts.

Referring to FIG. 16, an electronic device 1200 may include a semiconductor chip 1210. The semiconductor device 1210 may include a processor 1211, an embedded memory 1213, and a cache memory 1215.

The processor 1211 may include one or more processor cores C1 to Cn. The one or more cores C1 to Cn may process electrical data and/or electrical signals.

The electronic device 1200 may perform a specific function using the processed data and signals. For example, the processor 1211 may be an application processor.

The embedded memory 1213 may exchange first data DAT1 with the processor 1211. The first data DAT1 is data processed or to be processed by the one and more processor cores C1 to Cn. The embedded memory 1213 may manage the first data DAT1. For example, the embedded memory 1213 may buffer the first data DAT1. In other words, the embedded memory 1213 may act as a buffer memory or a working memory of the processor 1211.

In some embodiments, the electronic device 1200 may be applied to a wearable electronic device. The wearable electronic device may mainly perform a function requiring a relatively small quantity of operations. Thus, if the electronic device 1200 is applied to the wearable electronic device, the embedded memory 1213 may not have a great buffer capacity.

The embedded memory 1213 may be a SRAM. An operating speed of the SRAM may be faster than that of a DRAM. If the SRAM is embedded in the semiconductor chip 1210, it is possible to realize the electronic device 1200 having a small size and a fast operating speed. In addition, if the SRAM is embedded in the semiconductor chip 1210, consumption of an active power of the electronic device 1200 may be reduced. The SRAM may include at least one of the semiconductor devices according to embodiments of the inventive concepts.

The cache memory 1215 may be mounted on the semiconductor chip 1210 along with the one or more cores C1 to Cn. The cache memory 1215 may store cache data DATc. The cache data DATc may be data used by the one or more cores C1 to Cn. The cache memory 1215 may have a relatively small capacity but may have a very fast operating speed. The cache memory 1215 may include an SRAM including the semiconductor device according to embodiments of the inventive concepts. If the cache memory 1215 is used, it is possible to reduce an access number and an effective access time of the processor 1211 to the embedded memory 1213. Thus, the operating speed of the electronic device 1200 may be improved when the cache memory 1215 is used.

In FIG. 16, the cache memory 1215 is distinguished from the processor 1211 for the purpose of ease and convenience in explanation. However, in some embodiments, the cache memory 1215 may be configured to be included in the processor 1211. In other words, the inventive concepts are not limited to the embodiment illustrated in FIG. 16.

The processor 1211, the embedded memory 1213, and the cache memory 1215 may transmit electrical data on the basis of at least one of various interface protocols. For example, the processor 1211, the embedded memory 1213, and the cache memory 1215 may transmit electrical data on the basis of at least one interface protocol of universal serial bus (USB), small computer system interface (SCSI), peripheral component interconnect (PCI) express, advanced technology attachment (ATA), parallel ATA (PATA), serial ATA (SATA), serial attached SCSI (SAS), integrated drive electronics (IDE), or universal flash storage (UFS).

Figure 17:
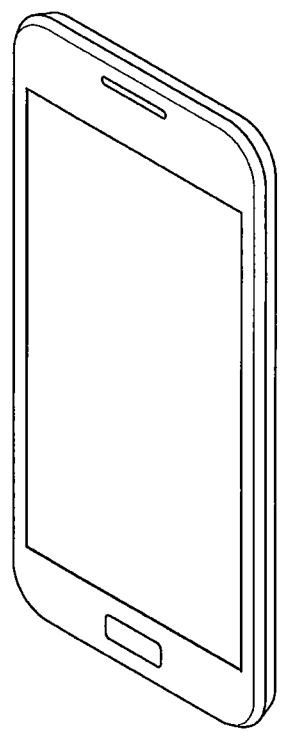
FIG. 17 illustrates a mobile phone implemented with an electronic system according to embodiments of the inventive concepts.

FIG. 17 illustrates a mobile phone 2000 implemented with the electronic system of FIG. 15. In some embodiments, the electronic system 1100 of FIG. 15 may be applied to a portable computer, an MP3 player, a navigation device, a solid state disk (SSD), a car, or household appliances.

According to some embodiments of the inventive concepts, it is possible to increase the contact area of the source/drain contact connected in common to a plurality of source/drain regions. As a result, a resistance of the source/drain contact connected to the plurality of the source/drain regions may be reduced to improve the electrical characteristics of the semiconductor device.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
first, second, and third active patterns protruding from a substrate, the first and second active patterns spaced apart from each other by a first distance, and the third active pattern spaced apart from the second active pattern by a second distance greater than the first distance;
a gate structure intersecting the first to third active patterns;
first, second, and third source/drain regions respectively disposed on the first, second, and third active patterns at a first side of the gate structure; and
a source/drain contact intersecting the first, second, and third active patterns, the source/drain contact connected in common to the first, second, and third source/drain regions,
wherein the source/drain contact comprises:
first, second, and third contact surfaces in contact with the first, second, and third source/drain regions, respectively; and an extension extending to a lower level of the device than the first to third contact surfaces and disposed between the second and third active patterns, and
wherein sidewalls of the extension are spaced apart from corresponding sidewalls of the second and third active patterns.

2. The semiconductor device of claim 1, wherein each of the first to third contact surfaces comprises:
a flat surface substantially parallel to a top surface of the substrate; and
an inclined surface extending downward toward the substrate from one end of the flat surface,
wherein a length of the inclined surface is greater than a length of the flat surface when viewed from a cross-sectional view of the source/drain contact.

3. The semiconductor device of claim 1, wherein the second contact surface comprises: a first inclined surface facing the first source/drain region; and a second inclined surface facing the third source/drain region, and
wherein the first inclined surface and the second inclined surface are asymmetric relative to one another.

4. The semiconductor device of claim 3, wherein a length of the second inclined surface is greater than a length of the first inclined surface when viewed from a cross-sectional view at the source/drain contact.

5. The semiconductor device of claim 3, wherein the first inclined surface has a first inclined angle with respect to a direction parallel to a top surface of the substrate,
wherein the second inclined surface has a second inclined angle with respect to the direction parallel to the top surface of the substrate, and
wherein the second inclined angle is greater than the first inclined angle.

6. A semiconductor device comprising:
a substrate including a first region and a second region;
a plurality of first active fin patterns protruding from the substrate of the first region;
a second active fin pattern protruding from the substrate of the second region;
a gate structure intersecting the plurality of first active fin patterns and the second active fin pattern;
a plurality of source/drain regions respectively disposed on the plurality of the first active fin patterns and the second active fin pattern at a first side of the gate structure; and
a source/drain contact intersecting the plurality of first active fin patterns and the second active fin pattern, the source/drain contact connected in common to the plurality of source/drain regions,
wherein the source/drain contact comprises: a plurality of contact surfaces in contact with the plurality of source/drain regions, respectively; and an extension extending to a lower level in the device than the plurality of contact surfaces,
wherein the extension is between the second active fin pattern and one of the first active fin patterns that is adjacent to the second region, and
wherein sidewalls of the extension are spaced apart from corresponding sidewalls of the second active fin pattern and the first active fin pattern adjacent to the second region.

7. The semiconductor device of claim 6, wherein at least one of the contact surfaces comprises:
a flat surface substantially parallel to a top surface of the substrate; and
an inclined surface extending downward toward the substrate from one end of the flat surface,
wherein a length of the inclined surface is greater than a length of the flat surface when viewed from a cross-sectional view at the source/drain contact.

8. The semiconductor device of claim 6, wherein at least a first one of the contact surfaces has curved surfaces, and
wherein at least a second one of the contact surfaces has a curved surface that is concave facing toward the source/drain contact.

9. The semiconductor device of claim 6, wherein the contact surface in contact with the source/drain region disposed on the first active fin pattern adjacent to the second region, comprises: a first inclined surface remote from the second region; and a second inclined surface adjacent to the second region, and
wherein the first inclined surface and the second inclined surface are asymmetric relative to one another.

10. A semiconductor device comprising:
a plurality of active patterns protruding from a substrate and spaced apart on the substrate by first and second distances;
a plurality of selective epitaxial growth portions, each grown on an upper surface of a respective one of the plurality of active patterns; and
a source/drain contact extending across the plurality of selective epitaxial growth portions to remain above top surfaces of first ones of the plurality of active patterns that are spaced apart by the first distance between the first ones of the plurality of active patterns and including an extension that extends toward the substrate to below top surfaces of two of the plurality of active patterns that are spaced apart by the second distance between the two of the plurality of active patterns.

11. The semiconductor device of claim 10, wherein the first distance is less than the second distance.

12. The semiconductor device of claim 10, wherein the second distance is predetermined so that the extension extends below the top surfaces of the two of the plurality of active patterns that are spaced apart by the second distance.

13. The semiconductor device of claim 12, wherein the extension contacts an insulating layer at a bottom of a recess between the two of the plurality of active patterns that are spaced apart by the second distance.

14. The semiconductor device of claim 10, wherein the two of the plurality of active patterns that are spaced apart by the second distance have different heights relative to the substrate.

15. The semiconductor device of claim 14, wherein the two of the plurality of active patterns that are spaced apart by the second distance include a first active pattern having a first height and a second active pattern having a second height that is less than the first height.

16. The semiconductor device of claim 15 wherein the first active pattern includes a first one of the selective epitaxial growth portions grown on sidewalls of the first active pattern and the second active pattern includes a second one of the selective epitaxial growth portions that is absent from sidewalls of the second active pattern.

17. The semiconductor device of claim 10 wherein the source/drain contact includes a respective flat central surface on each of the selective epitaxial growth portions.

18. The semiconductor device of claim 17 wherein the source/drain contact further includes at least one respective inclined edge surface on the each of the selective epitaxial growth portions.

19. The semiconductor device of claim 18 wherein the at least one respective inclined edge surface comprises a first respective inclined edge surface; and
wherein the source/drain contact further includes a second respective inclined edge surface on the each of the selective epitaxial growth portions opposite the first respective inclined edge surface.

20. The semiconductor device of claim 19 wherein the first and second respective inclined edge surfaces are inclined at different angles relative to the substrate.

* * * * *